(12) United States Patent
Tamura et al.

(10) Patent No.: US 9,391,622 B2
(45) Date of Patent: Jul. 12, 2016

(54) OSCILLATOR CIRCUIT AND FREQUENCY SYNTHESIZER

(71) Applicant: Sony Corporation, Tokyo (JP)

(72) Inventors: Masahisa Tamura, Kanagawa (JP); Hidenori Takeuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/608,264

(22) Filed: Jan. 29, 2015

(65) Prior Publication Data

US 2015/0229318 A1 Aug. 13, 2015

(30) Foreign Application Priority Data

Feb. 10, 2014 (JP) ................................. 2014-023064

(51) Int. Cl.
*H03L 7/00* (2006.01)
*H03L 7/083* (2006.01)
*H03B 5/12* (2006.01)
*H03L 7/085* (2006.01)
*H03L 7/093* (2006.01)

(52) U.S. Cl.
CPC ............... *H03L 7/083* (2013.01); *H03B 5/124* (2013.01); *H03B 5/1206* (2013.01); *H03B 5/1265* (2013.01); *H03L 7/085* (2013.01); *H03L 7/093* (2013.01); *H03B 2201/0291* (2013.01); *H03J 2200/10* (2013.01)

(58) Field of Classification Search
None
See application file for complete search history.

(56) References Cited

U.S. PATENT DOCUMENTS

| 5,182,528 A | * | 1/1993 | Zuta | H03L 7/02 331/1 A |
| 7,330,079 B2 | * | 2/2008 | Williams, III | H03L 7/099 331/25 |
| 2014/0070892 A1 | * | 3/2014 | Matsuoka | H03L 1/022 331/34 |

FOREIGN PATENT DOCUMENTS

JP 2009-010599 1/2009

* cited by examiner

*Primary Examiner* — Cassandra Cox
(74) *Attorney, Agent, or Firm* — Michael Best and Friedrich LLP

(57) ABSTRACT

An oscillator circuit includes: an arithmetic section configured to correct a first input code value and thereby generate a first code value that is within a first predetermined range, the arithmetic section being configured to correct a second input code value in correspondence with a correction amount of the first input code value and thereby generate a second code value, and the first predetermined range being narrower than a range of the first input code value; and an oscillation section configured to generate an oscillation signal having a frequency that varies at first sensitivity based on the first code value and varies at second sensitivity based on the second code value, the second sensitivity being higher than the first sensitivity.

10 Claims, 17 Drawing Sheets

OSCILLATOR CIRCUIT AND FREQUENCY SYNTHESIZER

CROSS REFERENCE TO RELATED APPLICATION

This application claims the benefit of Japanese Priority Patent Application JP 2014-023064 filed Feb. 10, 2014, the entire contents of which are incorporated herein by reference.

BACKGROUND

The present disclosure relates to an oscillator circuit that controls an oscillation frequency with the use of a digital signal, and to a frequency synthesizer that includes such an oscillator circuit.

A frequency synthesizer is often mounted on a semiconductor device in order to generate a signal having a desired frequency. The frequency synthesizer may be achieved by an analog phase locked loop (PLL), for example. The analog PLL includes a voltage controlled oscillator (VCO) circuit that is capable of causing an oscillation frequency to vary in correspondence with an analog control voltage. In such an analog PLL, a control voltage is so controlled as to cause the oscillation frequency to be constant.

In recent years, generations of a semiconductor manufacturing process have progressed, pressure resistance of a device is decreased, and a power source voltage of a semiconductor device is decreased accordingly. As a result, in the analog PLL, a voltage range of the control voltage of the voltage controlled oscillator circuit has been narrower, and it has therefore been more difficult to generate an oscillation signal having a wide frequency range. Accordingly, a digital PLL has been often used that includes a digitally-controlled oscillator (DCO) circuit that controls an oscillation frequency with the use of a digital signal. For example, Japanese Unexamined Patent Application Publication No. 2009-10599 discloses a DCO circuit that controls frequencies of a high-order capacitor bank and a low-order capacitor bank based on a frequency control word including a fractional bit and an integer bit.

SUMMARY

Generally, it is desired to reduce a phase noise in an oscillator circuit. It is expected to reduce a phase noise also in a DCO circuit.

It is desirable to provide an oscillator circuit and a frequency synthesizer that are capable of reducing a phase noise.

According to an embodiment of the present disclosure, there is provided an oscillator circuit including an arithmetic section and an oscillation section. The arithmetic section is configured to correct a first input code value and thereby generate a first code value that is within a first predetermined range, and is configured to correct a second input code value in correspondence with a correction amount of the first input code value and thereby generate a second code value. The first predetermined range is narrower than a range of the first input code value. The oscillation section is configured to generate an oscillation signal having a frequency that varies at first sensitivity based on the first code value and varies at second sensitivity based on the second code value. The second sensitivity is higher than the first sensitivity.

According to an embodiment of the present disclosure, there is provided a frequency synthesizer including a reference phase generation circuit, a phase comparison circuit, a frequency control circuit, an oscillator circuit, and a phase detection circuit. The reference phase generation circuit is configured to generate a reference phase signal. The phase comparison circuit is configured to detect a phase difference between the reference phase signal and a feedback phase signal. The frequency control circuit is configured to generate a first input code value and a second input code value based on a result of detection performed by the phase comparison circuit. The oscillator circuit is configured to generate an oscillation signal based on the first input code value and the second input code value. The phase detection circuit is configured to determine a phase of the oscillation signal and output the determined phase as the feedback phase signal. The oscillator circuit includes an arithmetic section and an oscillation section. The arithmetic section is configured to correct the first input code value and thereby generate a first code value that is within a first predetermined range, and is configured to correct the second input code value in correspondence with a correction amount of the first input code value and thereby generate a second code value. The first predetermined range is narrower than a range of the first input code value. The oscillation section is configured to generate the oscillation signal having a frequency that varies at first sensitivity based on the first code value and varies at second sensitivity based on the second code value. The second sensitivity is higher than the first sensitivity.

According to another embodiment of the present disclosure, there is provided a frequency synthesizer including a phase comparison circuit, a frequency control circuit, an oscillator circuit, and a frequency divider circuit. The phase comparison circuit is configured to detect a phase difference between an input clock signal and a feedback clock signal. The frequency control circuit is configured to generate a first input code value and a second input code value based on a result of detection performed by the phase comparison circuit. The oscillator circuit is configured to generate an oscillation signal based on the first input code value and the second input code value. The frequency divider circuit is configured to divide a frequency of the oscillation signal and thereby generate the feedback clock signal. The oscillator circuit includes an arithmetic section and an oscillation section. The arithmetic section is configured to correct the first input code value and thereby generate a first code value that is within a first predetermined range, and is configured to correct the second input code value in correspondence with a correction amount of the first input code value and thereby generate a second code value. The first predetermined range is narrower than a range of the first input code value. The oscillation section is configured to generate the oscillation signal having the frequency that varies at first sensitivity based on the first code value and varies at second sensitivity based on the second code value. The second sensitivity is higher than the first sensitivity.

In the oscillator circuit and the frequency synthesizer each according to an embodiment of the present disclosure, the first code value and the second code value are generated based on the first input code value and the second input code value, and the oscillation signal is generated based on the generated first and second code values. In this case, the first input code value is corrected and the first code value within the first predetermined range that is narrower than the range of the first input code value is thereby generated. Also, the second input code value is corrected in correspondence with the correction amount of the first input code value, and the second code value is thereby generated.

According to the oscillator circuit and the frequency synthesizer according to embodiments of the present disclosure, the first input code value is corrected and the first code value within the first predetermined range that is narrower than the range of the first input code value is thereby generated. Also, the second input code value is corrected in correspondence with the correction amount of the first input code value, and the second code value is thereby generated. As a result, it is possible to reduce a phase noise. It is to be noted that effects of the present technology are not limited to the effects described above, and may include any of effects described in the present disclosure.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Some embodiments of the present disclosure are described below in detail with reference to the drawings.
[Configuration Example]
(General Configuration Example)

Figure 1:
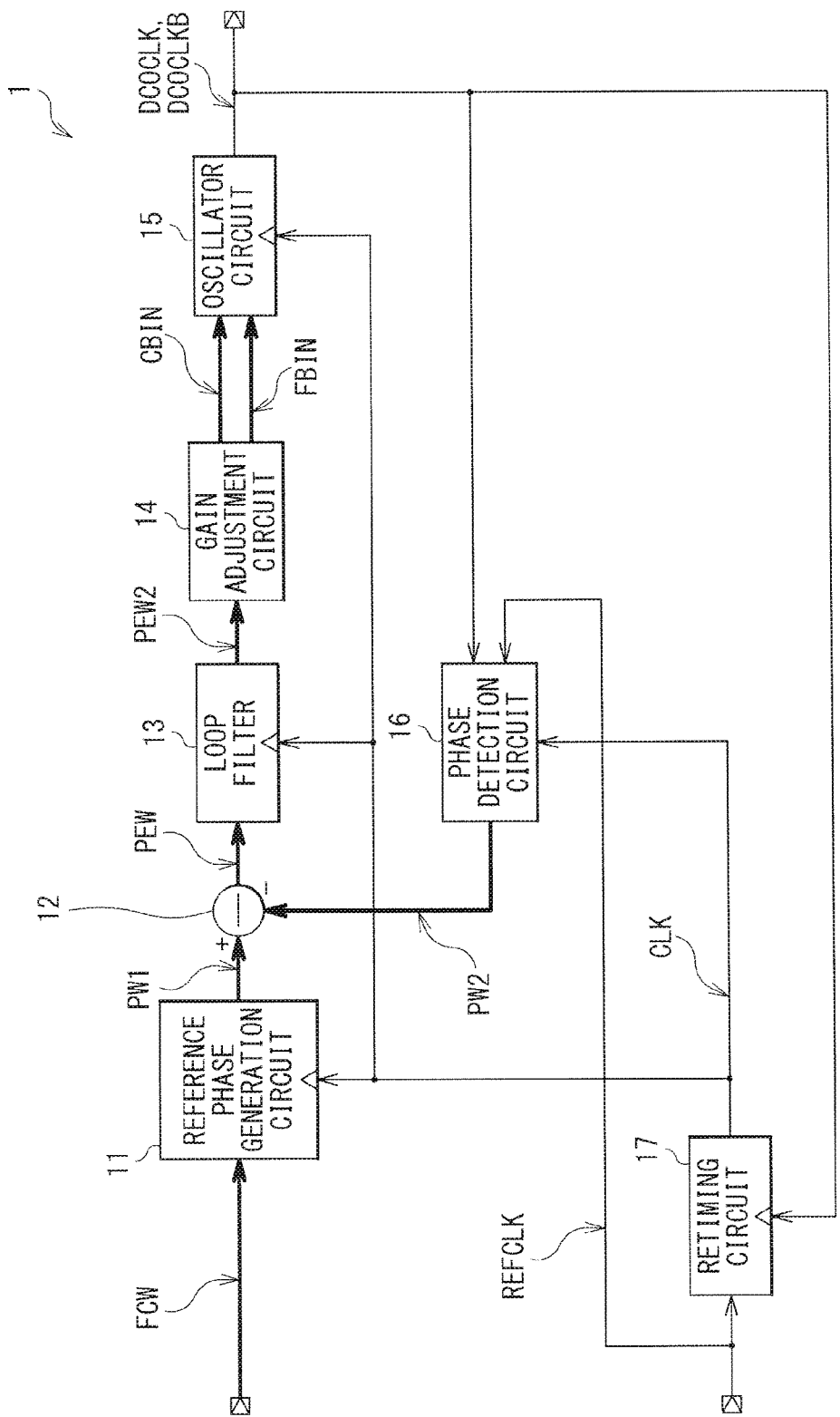
FIG. 1 is a block diagram illustrating a configuration example of a frequency synthesizer according to an embodiment of the present disclosure.

FIG. 1 illustrates a configuration example of a frequency synthesizer according to a first embodiment. In FIG. 1, a wiring illustrated by a thick line represents a so-called bus wiring that transmits a word configured of a plurality of bits, and a wiring illustrated by a thin line represents a wiring that transmits a signal or a differential signal. A frequency synthesizer 1 may be a digital PLL that includes a digitally-controlled oscillator (DCO) circuit. It is to be noted that an oscillator circuit according to an embodiment of the present disclosure is embodied by the present embodiment, and is therefore described together.

The frequency synthesizer 1 may include a reference phase generation circuit 11, a phase comparison circuit 12, a loop filter 13, a gain adjustment circuit 14, an oscillator circuit 15, a phase detection circuit 16, and a retiming circuit 17.

The reference phase generation circuit 11 is configured to generate a reference phase word PW1 based on a frequency division ratio word FCW and a clock signal CLK. Specifically, the reference phase generation circuit 11 cumulatively adds a value represented by the frequency division ratio word FCW to generate a reference phase value, and outputs the generated reference phase value as a reference phase word PW1.

The phase comparison circuit 12 is configured to generate a phase error word PEW based on the reference phase word PW1 and a phase word PW2. Specifically, the phase comparison circuit 12 subtracts a phase value represented by the phase word PW2 from a reference phase value represented by the reference phase word PW1 to determine a phase error value, and outputs the determined phase error value as the phase error word PEW.

The loop filter 13 is configured to generate a phase error word PEW2 based on the phase error word PEW and the clock signal CLK. Specifically, the loop filter 13 is configured to smooth the phase error value represented by the phase error word PEW, and output the smoothed phase error value as the phase error word PEW2.

The gain adjustment circuit 14 is configured to generate frequency control words CBIN and FBIN based on the phase error word PEW2. The frequency control word CBIN is a word for coarsely adjusting a frequency fo (described later), and the frequency control word FBIN is a word for finely adjusting the frequency fo. In this example, the frequency control word CBIN for coarse adjustment may be a word configured of 7 bits (CBIN [6:0]) and having a binary format, and may represent an unsigned value (from 0 to 127). The frequency control word FBIN for fine adjustment may be a word configured of 10 bits (FBIN [9:0]) and having a binary format, and may represent a signed value (from −512 to +511) in this example. The gain adjustment circuit 14 is configured to multiply a value represented by the phase error word PEW2 by a predetermined value (gain), and generate the frequency control words CBIN and FBIN based on a result of the multiplication.

The oscillator circuit 15 is configured to generate clock signals DCOCLK and DCOCLKB based on the frequency control words CBIN and FBIN and the clock signal CLK. In this example, the clock signals DCOCLK and DCOCLKB may be signals having phases that are shifted from each other by 180 degrees, and configure a differential signal. It is to be noted that the clock signal generated by the oscillator circuit 15 is configured of the differential signal including the clock signals DCOCLK and DCOCLKB in this example; however, the clock signal generated by the oscillator circuit 15 is not limited thereto, and may be a signal-ended signal instead thereof.

Figure 2:
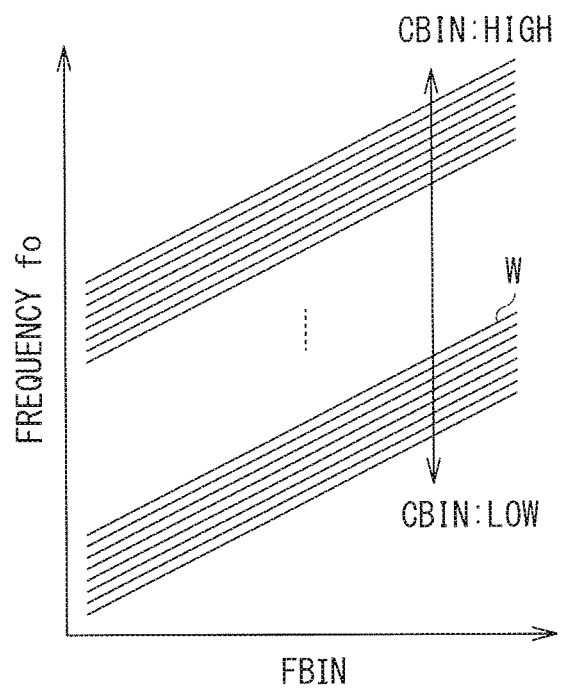
FIG. 2 is an explanation diagram illustrating frequency control characteristics of an oscillator circuit illustrated in FIG. 1.

FIG. 2 illustrates frequency control characteristics of the oscillator circuit 15. In FIG. 2, a horizontal axis represents a value of the frequency control word FBIN, and a vertical axis represents the frequency fo of the clock signals DCOCLK and DCOCLKB. FIG. 2 illustrates a plurality of control characteristics W (one-hundred-and-twenty-eight control characteristics W, in this example). The oscillator circuit 15 selects one of the plurality of frequency control characteristics W in correspondence with a value of the frequency control word CBIN. In this example, the frequency fo is lower as the value of the frequency control word CBIN is lower, and the frequency fo is higher as the value of the frequency control word CBIN is higher. Also, the oscillator circuit 15 causes the frequency fo of the clock signals DCOCLK and DCOCLKB to vary in correspondence with the value of the frequency control word FBIN. In this example, the frequency fo is lower as the value of the frequency control word FBIN is lower, and the frequency fo is higher as the value of the frequency control word FBIN is higher. As illustrated in FIG. 2, a variation amount of the frequency fo in the case where the frequency control word CBIN is caused to vary is larger than a variation amount of the frequency fo in the case where the frequency control word FBIN is caused to vary. Thus, the oscillator circuit 15 coarsely adjusts the frequency fo with the use of the frequency control word CBIN and finely adjusts the frequency fo with the use of the frequency control word FBIN.

The phase detection circuit 16 is configured to generate the phase word PW2 based on the clock signals DCOCLK and DCOCLKB, a reference clock signal REFCLK, and the clock signal CLK. Specifically, the phase detection circuit 16 is configured to determine a phase of the differential signal including the clock signals DCOCLK and DCOCLKB as a value having a fixed-point format and output the determined value as the phase word PW2 at a timing based on the clock signal CLK.

The retiming circuit 17 is configured to perform retiming on the reference clock signal REFCLK at a timing based on the clock signals DCOCLK and DCOCLKB, and output the signal that has been subjected to the retiming as the clock signal CLK.

This configuration allows negative feedback control to be performed in the frequency synthesizer 1 so that the frequency fo of the clock signals DCOCLK and DCOCLKB has a value (targeted frequency f target) of a product of the frequency of the reference clock signal REFCLK and the value represented by the frequency division ratio word FCW. Specifically, for example, when the frequency fo is higher than the targeted frequency f target, the value represented by the phase word PW2 is larger than the value represented by the reference phase word PW1, and the value represented by the phase error word PEW is caused to be smaller. Accordingly, the oscillator circuit 15 causes the frequency fo to be lower. Alternatively, for example, when the frequency fo is lower than the targeted frequency f target, the value represented by the phase word PW2 is smaller than the value represented by the reference phase word PW1, and the value represented by the phase error word PEW is caused to be larger. Accordingly, the oscillator circuit 15 causes the frequency fo to be higher. The negative feedback control is thus performed in the frequency synthesizer 1 so that the frequency fo of the clock signals DCOCLK and DCOCLKB becomes the targeted frequency f target.

At this time, the frequency synthesizer 1 may perform the negative feedback control in two stages in this example. Specifically, for example, in an initial state such as a state immediately after a power source is turned on, the frequency synthesizer 1 fixes the frequency control word FBIN for fine adjustment to a predetermined value and causes the frequency control word CBIN for coarse adjustment to vary to perform a negative feedback operation, and thereby causes the frequency fo to be closer to the targeted frequency f target. Thereafter, the frequency synthesizer 1 fixes the frequency control word CBIN for coarse adjustment and causes the frequency control word FBIN for fine adjustment to vary to perform a negative feedback operation, and thereby causes the frequency fo to be closer to the targeted frequency f target to achieve a phase synchronization state.

(Oscillator Circuit 15)

Figure 3:
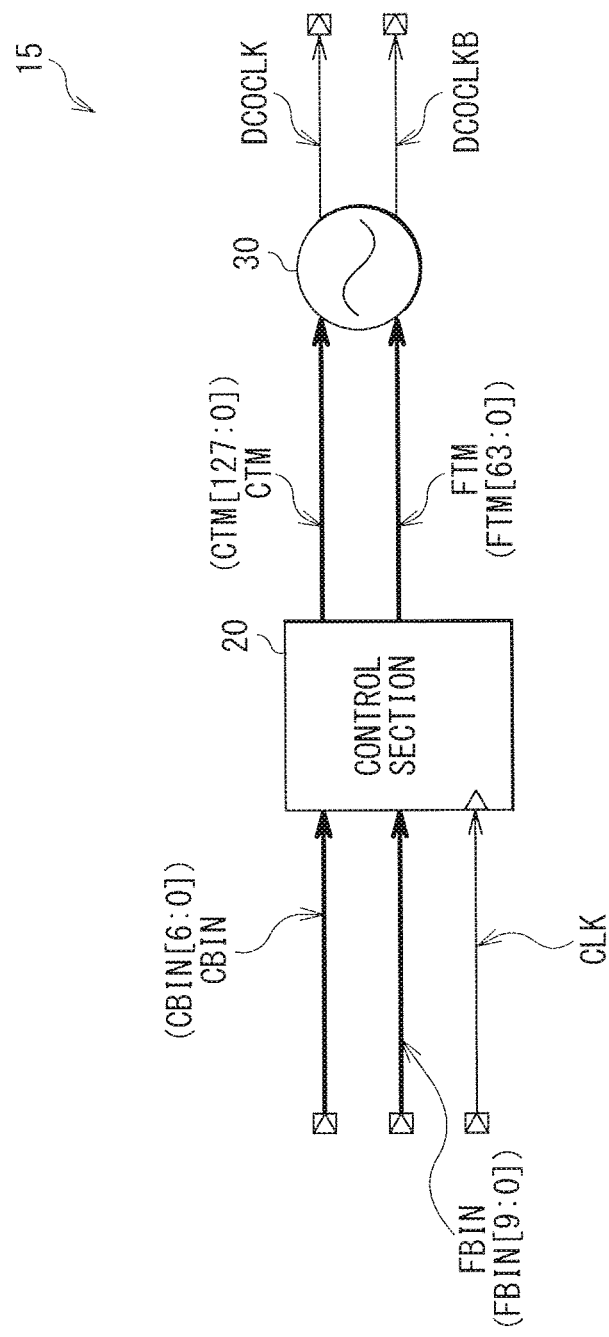
FIG. 3 is a block diagram illustrating a configuration example of the oscillator circuit illustrated in FIG. 1.

FIG. 3 illustrates a configuration example of the oscillator circuit 15. The oscillator circuit 15 includes a control section 20 and an oscillation section 30.

The control section 20 is configured to convert the frequency control words CBIN and FBIN, based on the frequency control words CBIN and FBIN and the clock signal CLK, into frequency control words CTM and FTM that represent thermometer codes, respectively, and control the oscillation section 30 with the use of these frequency control words CTM and FTM. The frequency control word CTM is a word for coarsely adjusting a frequency, and may represent a thermometer code configured of 128 bits (CTM [127:0]). The frequency control word FTM is a word for finely adjusting a frequency, and may represent a thermometer code configured of 64 bits (FTM [63:0]) in this example. As described later, the control section 20 is configured to generate the frequency control word FTM that represents a value in a range (from 0 to 63, in this example) that is narrower than the possible range (from −512 to +511, in this example) of the frequency control word FBIN based on the value represented by the frequency control word FBIN. The control section 20 is also configured to generate the frequency control word CTM based on the frequency control words FBIN and CBIN.

Figure 4:
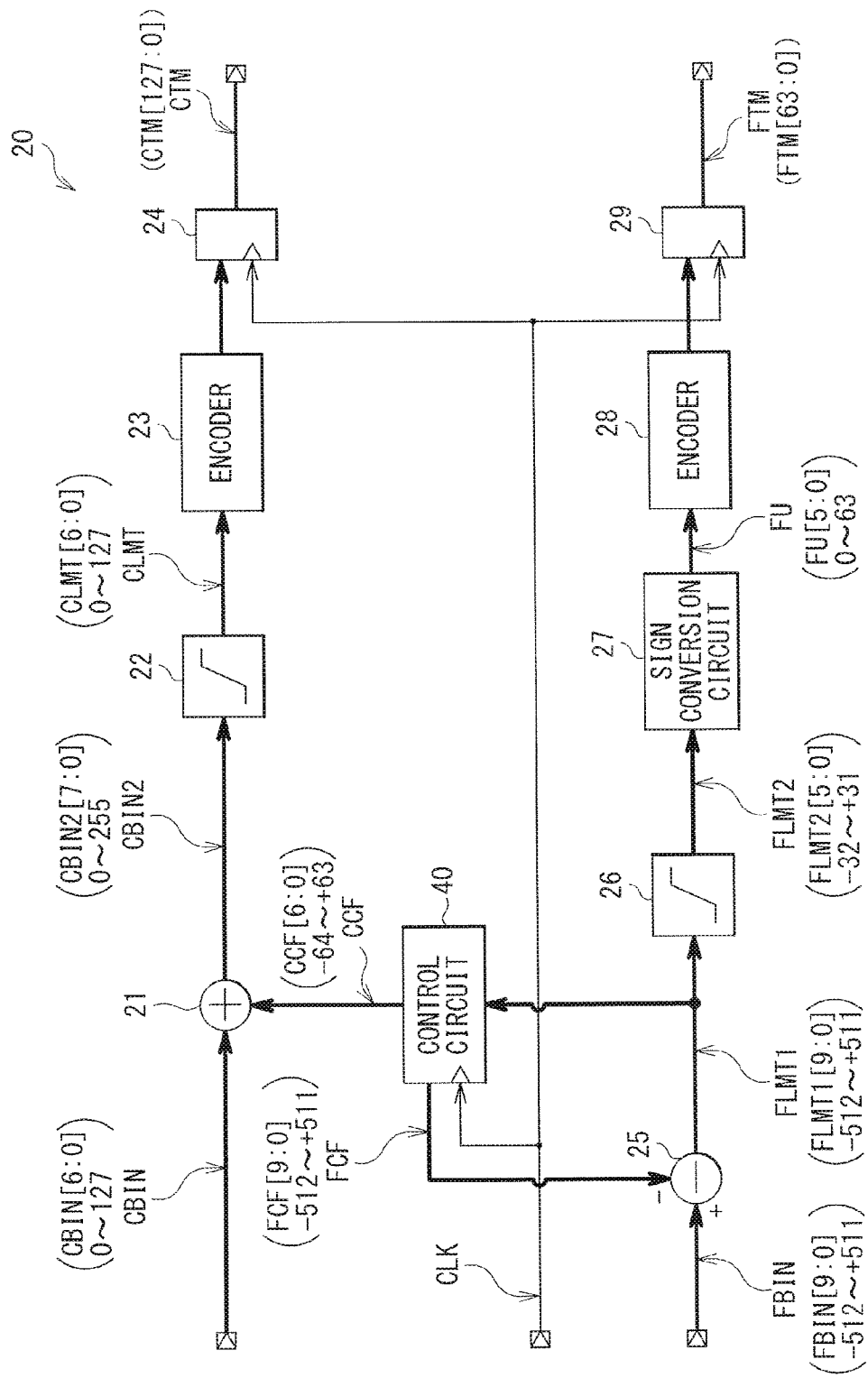
FIG. 4 is a block diagram illustrating a configuration example of a control section illustrated in FIG. 3.

FIG. 4 illustrates a configuration example of the control section 20. The control section 20 may include an addition circuit 21, a limiter 22, an encoder 23, a flip flop 24, a subtraction circuit 25, a limiter 26, a sign conversion circuit 27, an encoder 28, a flip flop 29, and a control circuit 40. The addition circuit 21, the limiter 22, the encoder 23, and the flip flop 24 are related to the frequency control word CBIN for coarse adjustment. The subtraction circuit 25, the limiter 26, the sign conversion circuit 27, the encoder 28, and the flip flop 29 are related to the frequency control word FBIN for fine adjustment.

The addition circuit 21 is configured to add the value represented by the frequency control word CBIN for coarse adjustment and a value represented by a correction word CCF, and thereby generate a frequency control word CBIN2 that represents a result of the addition. The correction word CCF may be a word configured of 7 bits (CCF [6:0]) and having a binary formant, and may represent a signed value (from −64 to +63) in this example. The frequency control word CBIN2 may be a word configured of 8 bits (CBIN2 [7:0]) and having a binary format, and may represent an unsigned value (from 0 to 255) in this example. A value of the frequency control word CBIN2 is caused to fall within a range defined by the limiter 22 (within a range from 0 to 127, in this example).

In a case where the value represented by the frequency control word CBIN2 is out of the predetermined range, the limiter 22 is configured to limit the value represented by the frequency control word CBIN2 to a lower limit value or an upper limit value of the predetermined range, and thereby generate a frequency control word CLMT. In this example, the upper limit value may be "127", and the lower limit value may be "0". The frequency control word CLMT may be a word configured of 7 bits (CLMT [6:0]) and having a binary format, and may represent an unsigned value (from 0 to 127) in this example.

The encoder 23 is configured to generate a thermometer code based on the frequency control word CLMT. The flip flop 24 is configured to perform retiming on the thermometer code generated by the encoder 23 at a timing based on the clock signal CLK, and output the thermometer code that has been subjected to the retiming as a frequency control word CTM (CTM [127:0]). Thus, "1" of the number same as the value represented by the frequency control word CLMT may appear sequentially from the least significant bit CTM [0] in the frequency control word CTM, for example.

The subtraction circuit 25 is configured to subtract a value represented by a correction word FCF from the value represented by the frequency control word FBIN for fine adjustment, and thereby generate a frequency control word FLMT1 that represents a result of the subtraction. The correction word FCF may be a word configured of 10 bits (FCF [9:0]) and having a binary formant, and may represent a signed value (from −512 to +511) in this example. The frequency control word FLMT1 may be a word configured of 10 bits (FLMT1 [9:0]) and having a binary format, and may represent a signed value (from −512 to +511) in this example. As described later, the value of the frequency control word FLMT1 is controlled to fall within a range Rlim defined by the limiter 26 (within a range from −32 to +31, in this example).

In a case where the value represented by the frequency control word FLMT1 is out of the predetermined range Rlim, the limiter 26 is configured to limit the value represented by the frequency control word FLMT1 to a lower limit value or an upper limit value of the predetermined range Rlim, and thereby generate a frequency control word FLMT2. In this example, the upper limit value may be "+31", and the lower limit value may be "−32". The frequency control word FLMT2 may be a word configured of 6 bits (FLMT2 [5:0]) and having a binary format, and may represent a signed value (from −32 to +31) in this example.

The sign conversion circuit 27 is configured to convert the frequency control word FLMT2 that represents a signed value into a frequency control word FU that represents an unsigned value. The frequency control word FU may be a word configured of 6 bits (FU [5:0]) and having a binary format, and may represent an unsigned value (from 0 to 63) in this example.

The encoder 28 is configured to generate a thermometer code based on the frequency control word FU. The flip flop 29 is configured to perform retiming on the thermometer code generated by the encoder 28 at a timing based on the clock signal CLK, and output the thermometer code that has been subjected to the retiming as a frequency control word FTM. Thus, "1" of the number same as the value represented by the frequency control word FU may appear sequentially from the least significant bit FTM [0] in the frequency control word FTM, for example.

The control circuit 40 is configured to generate the correction words CCF and FCF based on the frequency control word FLMT1 and the clock signal CLK. Specifically, the control circuit 40 is configured to so generate the correction word FCF that the value of the frequency control word FLMT1 falls within the range Rlim defined by the limiter 26 (within the range from −32 to +31, in this example), and generate the correction word CCF corresponding to the generated correction word FCF.

Figure 5:
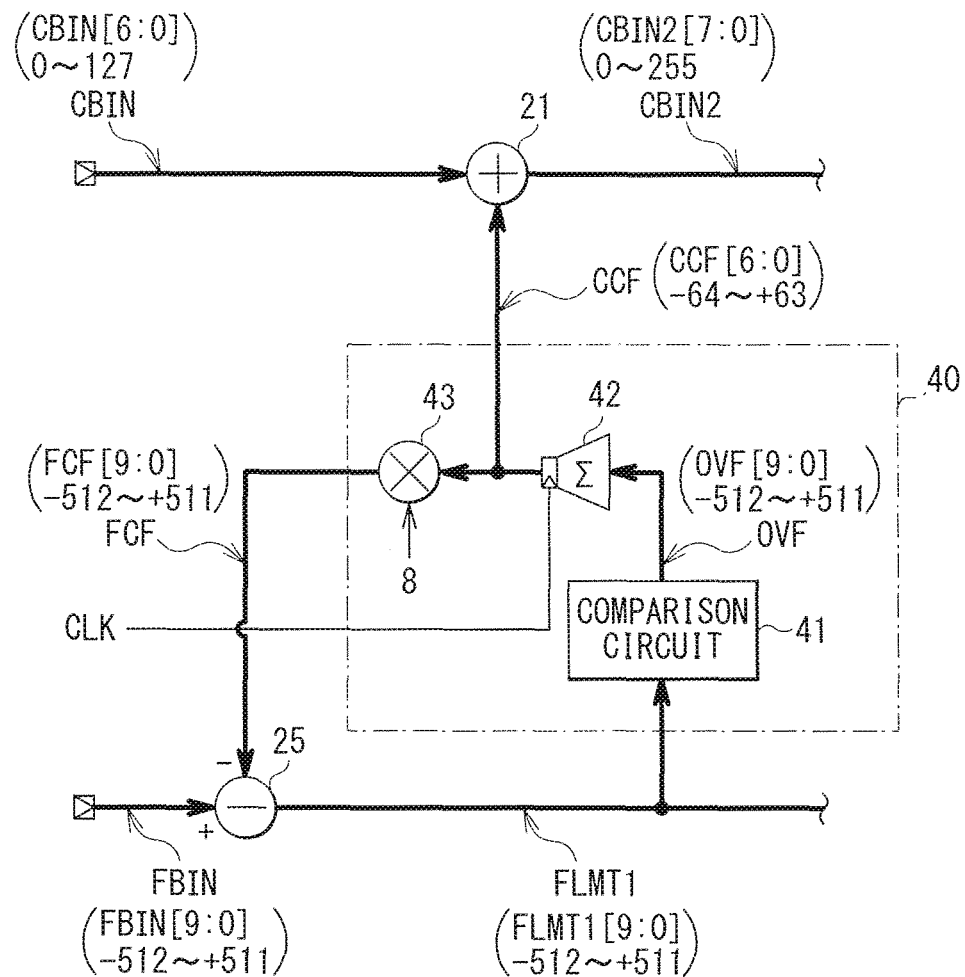
FIG. 5 is a block diagram illustrating a configuration example of a control circuit illustrated in FIG. 4.

FIG. 5 illustrates a configuration example of the control circuit 40. FIG. 5 also illustrates the addition circuit 21 and the subtraction circuit 25 in addition to the control circuit 40. The control circuit 40 may include a comparison circuit 41, a cumulative addition circuit 42, and a multiplication circuit 43.

The comparison circuit 41 is configured to compare the value represented by the frequency control word FLMT1 to a plurality of predetermined threshold values, and output a result of the comparison as a comparison result word OVF. The comparison result word OVF may be a word configured of 10 bits (OVF [9:0]) and having a binary format, and may represent a signed value (from −512 to +511) in this example.

Figure 6:
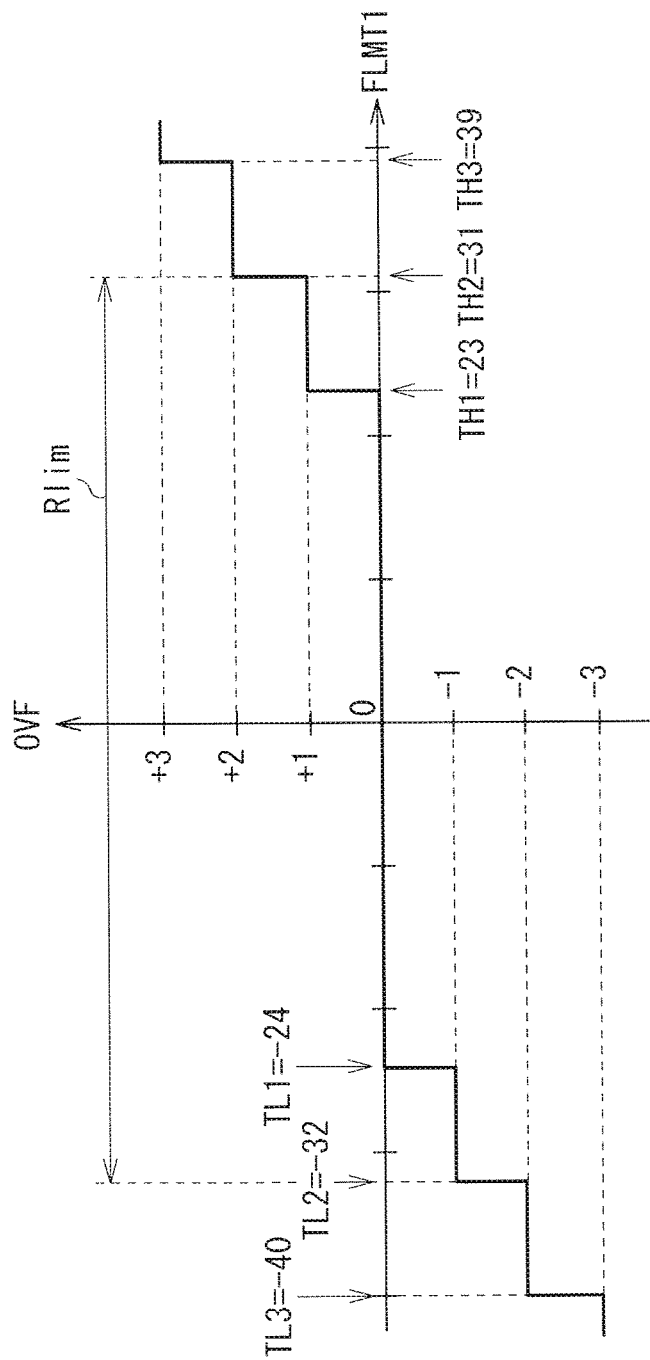
FIG. 6 is an explanation diagram illustrating an operation example of a comparison circuit illustrated in FIG. 5.

FIG. 6 illustrates an example of an operation of the comparison circuit 41. FIG. 6 also shows the range Rlim defined by the limiter 26 together. The comparison circuit 41 compares the value represented by the frequency control word FLMT1 to a plurality of threshold values TH1, TH2, TH3, . . . and a plurality of threshold values TL1, TL2, TL3, . . . . In this example, the threshold value TH1 may be "23", the threshold value TH2 may be "31", the threshold value TH3 may be "39", the threshold value TL1 may be "−24", the threshold value TL2 may be "−32", and the threshold value TL3 may be "−40". In other words, the threshold value TH2 may be equal to the upper limit value of the range Rlim, and the threshold value TL2 may be equal to the lower limit value of the range Rlim in this example. The comparison circuit 41 generates the comparison result word OVF that represents "0", when the value represented by the frequency control word FLMT1 is equal to or larger than the threshold value TL1 and equal to or smaller than the threshold value TH1. Alternatively, the comparison circuit 41 generates the comparison result word OVF that represents "1", when the value represented by the frequency control word FLMT1 is larger than the threshold value TH1 and equal to or smaller than the threshold value TH2. Alternatively, the comparison circuit 41 generates the comparison result word OVF that represents "2", when the value represented by the frequency control word FLMT1 is larger than the threshold value TH2 and equal to or smaller than the threshold value TH3. The comparison circuit 41 also generates the comparison result word OVF that represents "2", when the value represented by the frequency control word FLMT1 is further larger. Alternatively, the comparison circuit 41 generates the comparison result word OVF that represents "−1", when the value represented by the frequency control word FLMT1 is equal to or larger than the threshold value TL2 and smaller than the threshold value TL1. Alternatively, the comparison circuit 41 generates the comparison result word OVF that represents "−2", when the value represented by the frequency control word FLMT1 is equal to or larger than the threshold value TL3 and smaller than the threshold value TL2. The comparison circuit 41 generates the comparison result word OVF that represents "−2", when the value represented by the frequency control word FLMT1 is further smaller.

The cumulative addition circuit 42 is configured to cumulatively add the value represented by the comparison result word OVF, and output a result of the cumulative addition as the correction word CCF.

The multiplication circuit 43 is configured to multiply the value represented by the correction word CCF by predetermined number ("8", in this example), and output a result of the multiplication as the correction word FCF. In this example, the multiplication circuit 43 may achieve the multiplication by "8" by shifting the correction word CCF by 3 bits. The multiplication value "8" corresponds to the number of variable capacitors 35 in each variable capacitor group 36 in the capacitor bank 33 for coarse adjustment.

According to such a configuration, in the control section 20, for example, when the frequency control word FLMT1 represents a value that is larger than the threshold value TH1, the value represented by the comparison result word OVF is caused to be larger and the value represented by the correction word FCF is also caused to be larger. Accordingly, the subtraction circuit 25 causes the value represented by the frequency control word FLMT1 to be smaller. Alternatively, for example, when the frequency control word FLMT1 represents a value that is smaller than the threshold value TL1, the value represented by the comparison result word OVF is caused to be smaller and the value represented by the correction word FCF is also caused to be smaller. Accordingly, the subtraction circuit 25 causes the value represented by the frequency control word FLMT1 to be larger. Thus, negative feedback control is so performed in the control section 20 that the value of the frequency control word FLMT1 falls within the range Rlim defined by the limiter 26 (within the range from −32 to +31, in this example).

As illustrated in FIG. 3, the oscillation section 30 is configured to generate the clock signals DCOCLK and DCOCLKB having the frequency fo in accordance with the frequency control words CTM and FTM based on the frequency control words CTM and FTM.

Figure 7:
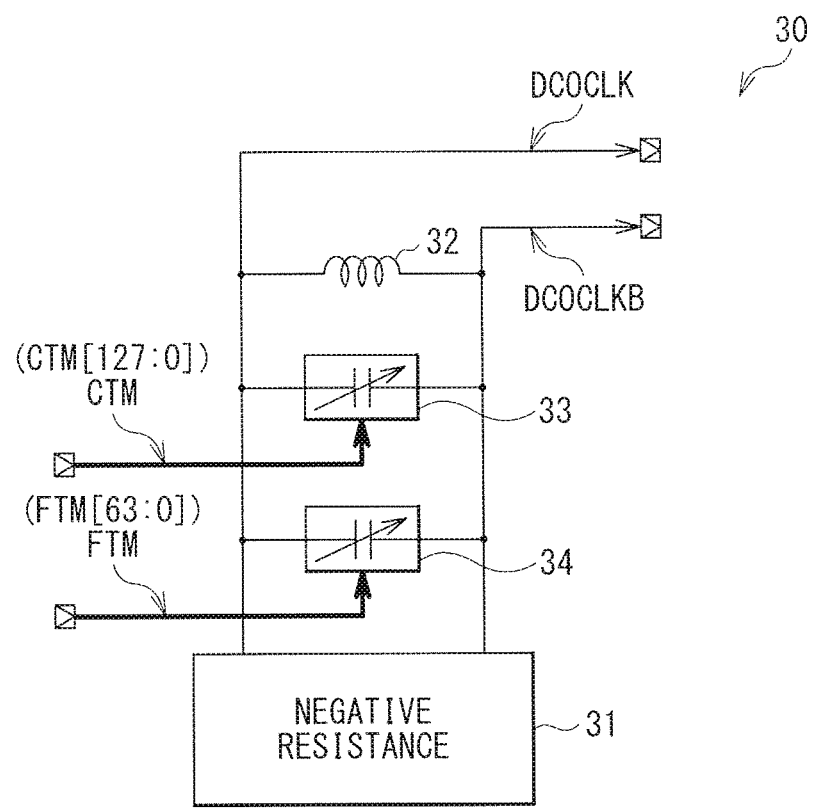
FIG. 7 is a block diagram illustrating a configuration example of an oscillation section illustrated in FIG. 3.

FIG. 7 illustrates a configuration example of the oscillation section 30. The oscillation section 30 may include a negative resistance 31, an inductor 32, and capacitor banks 33 and 34.

The negative resistance 31 may include an active element such as a transistor. The negative resistance 31 is configured to so act that a resistance value between a first end and a second end thereof has a negative polarity. The first end of the negative resistance 31 may be connected to a first end of the inductor 32, a first end of the capacitor bank 33, a first end of the capacitor bank 34, and the like. The second end of the negative resistance 31 may be connected to a second end of the inductor 32, a second end of the capacitor bank 33, a second end of the capacitor bank 34, and the like.

The first end of the inductor 32 may be connected to the first end of the capacitor bank 33, the first end of the capacitor bank 34, the first end of the negative resistance 31, and the like. The second end of the inductor 32 may be connected to the second end of the capacitor bank 33, the second end of the capacitor bank 34, the second end of the negative resistance 31, and the like.

The capacitor bank 33 is configured to have a capacitance between the first and second ends that varies based on the frequency control word CTM for coarse adjustment. The first end of the capacitor bank 33 may be connected to the first end of the inductor 32, the first end of the capacitor bank 34, and the first end of the negative resistance 31.

Figure 8:
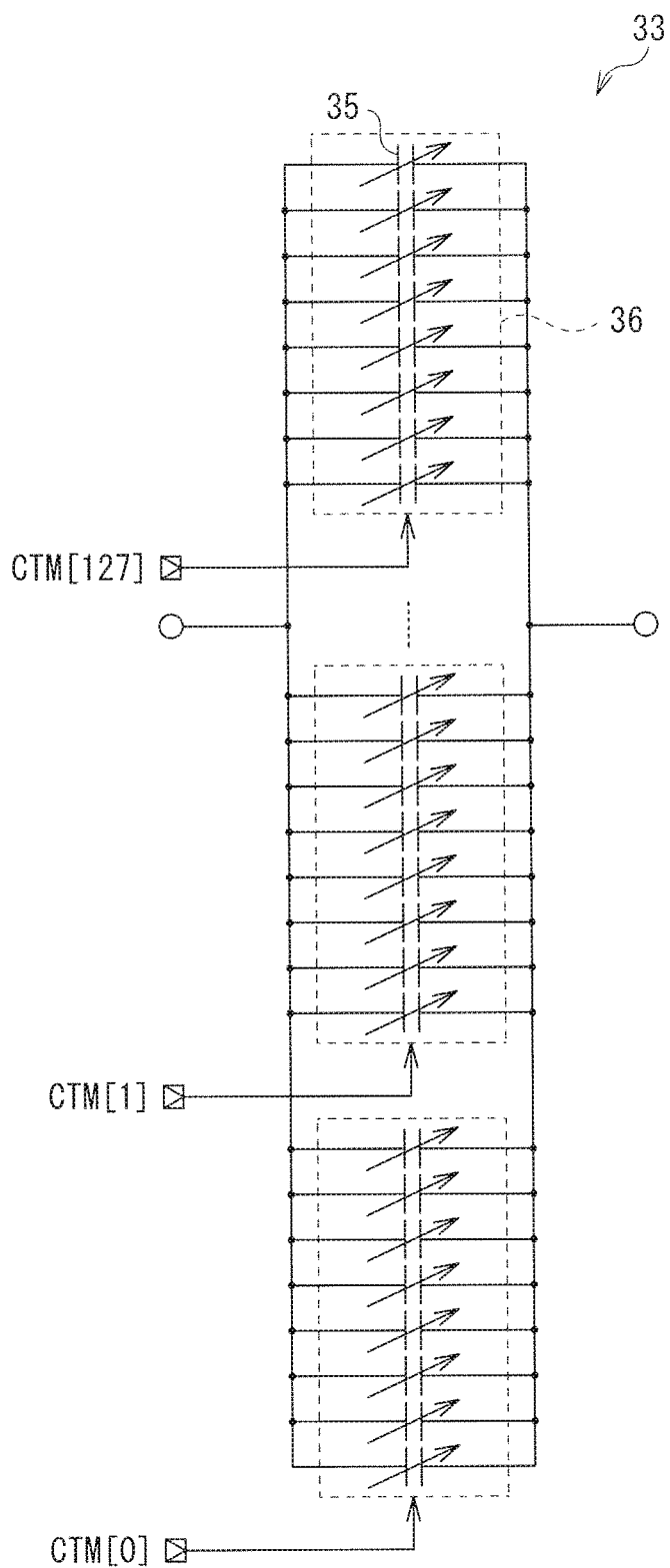
FIG. 8 is a circuit diagram illustrating a configuration example of a capacitor bank for coarse adjustment illustrated in FIG. 7.

FIG. 8 illustrates a configuration example of the capacitor bank 33. In this example, the capacitor bank 33 may include one-hundred-and-twenty-eight variable capacitor groups 36. Each of the variable capacitor groups 36 is provided in correspondence with each bit CTM [127:0] of the frequency control word CTM. Each of the variable capacitor groups 36 may include eight variable capacitors 35 in this example. The number "8" of the variable capacitors 35 corresponds to the multiplication value "8" used in the multiplication circuit 43. Each of the variable capacitors 35 is configured to have a capacitance between both ends thereof that varies based on a voltage applied to a capacitance control terminal. The eight variable capacitors 35 are connected in parallel to one another, and the capacitance control terminals thereof are also connected to one another. The variable capacitor group 36 thus serves as a variable capacitor that has a capacitance eight times the capacitance of the variable capacitor 35. A voltage is applied to the capacitance control terminals of the eight variable capacitors 35 in the variable capacitor group 36 based on bits corresponding to the frequency control word CTM. A capacitance between both ends of the variable capacitor group 36 varies based on the applied voltage. The variable capacitor groups 36 are connected in parallel to one another. This configuration causes the capacitance between both ends to vary based on the frequency control word CTM in the capacitor bank 33.

The capacitor bank 34 is configured to have a capacitance between both ends thereof that varies based on the frequency control word FTM for fine adjustment. The first end of the capacitor bank 34 may be connected to the first end of the inductor 32, the first end of the capacitor bank 33, and the first end of the negative resistance 31.

Figure 9:
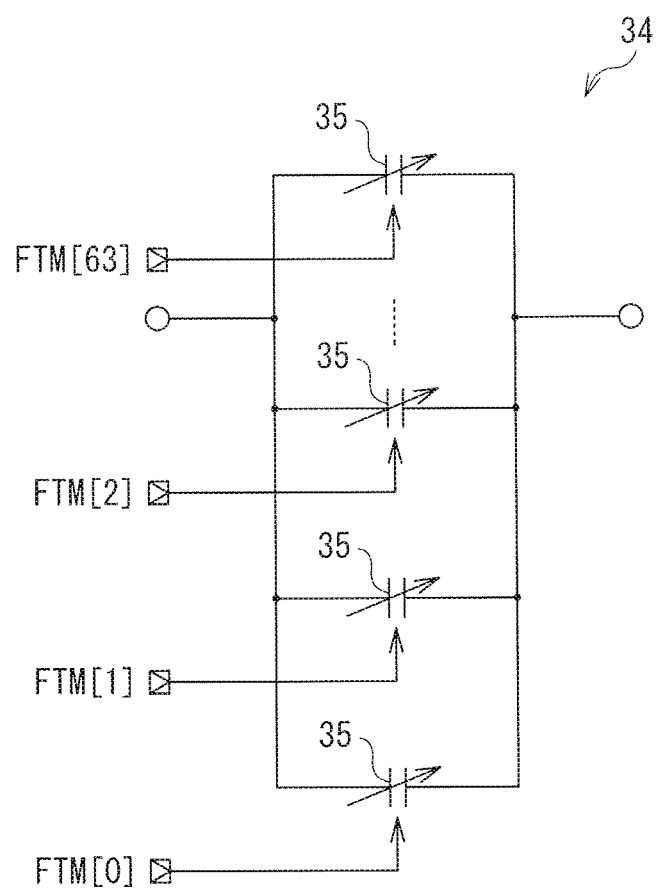
FIG. 9 is a circuit diagram illustrating a configuration example of a capacitor bank for fine adjustment illustrated in FIG. 7.

FIG. 9 illustrates a configuration example of the capacitor bank 34. In this example, the capacitor bank 34 may include sixty-four variable capacitors 35. Each of the variable capacitors 35 is provided in correspondence with each bit FTM [63:0] of the frequency control word FTM. A voltage is applied to the capacitance control terminals of the variable capacitors 35 based on bits corresponding to the frequency control word FTM. A capacitance between both ends of the variable capacitor 35 varies based on the applied voltage. The variable capacitors 35 are connected in parallel to one another. This configuration causes the capacitance between both ends to vary based on the frequency control word FTM in the capacitor bank 34.

The capacitor bank 33 and the capacitor bank 34 are different from each other in variation amount of the capacitance between both ends in a case where one of the bits in the frequency control words CTM and FTM varies. Specifically, in this example, the variation amount of the capacitance between the both ends of the capacitor bank 33 that results from variation of one of the bits of the frequency control word CTM is eight times the variation amount of the capacitance between the both ends of the capacitor bank 34 that results from variation of one of the bits of the frequency control word FTM.

This configuration allows the oscillation section 30 to perform an oscillation operation at a resonance frequency (frequency fo) that is defined by the inductance of the inductor 32 and the capacitances of the capacitor banks 33 and 34, and to generate the clock signals DCOCLK and DCOCLKB. At that time, a variation amount of the frequency fo in the case where the frequency control word CTM is caused to vary is larger than a variation amount of the frequency fo in the case where the frequency control word FTM is caused to vary. Thus, the oscillation section 30 is allowed to coarsely adjust the frequency fo based on the frequency control word CTM and to finely adjust the frequency fo based on the frequency control word FTM.

In this example, the oscillator circuit 15 corresponds to a specific but non-limiting example of "oscillator circuit" in the present disclosure. The control circuit 40, the addition circuit 21, and the subtraction circuit 25 correspond to specific but non-limiting examples of "arithmetic section" in the present disclosure. The value of the frequency control word FBIN corresponds to a specific but non-limiting example of "first input code value" in the present disclosure. The value of the frequency control word CBIN corresponds to a specific but non-limiting example of "second input code value" in the present disclosure. The value of the frequency control word FLMT1 corresponds to a specific but non-limiting example of "first code value" in the present disclosure. The value of the frequency control word CBIN2 corresponds to a specific but non-limiting example of "second code value".

[Operation and Functions]

Subsequently, an operation and functions of the frequency synthesizer 1 of the present embodiment are described.

(Summary of General Operation)

First, referring to FIGS. 1, 3, 4, etc., summary of a general operation of the frequency synthesizer 1 is provided. The reference phase generation circuit 11 generates the reference phase word PW1 based on the frequency division ratio word FCW and the clock signal CLK. The phase comparison circuit 12 generates the phase error word PEW based on the reference phase word PW1 and the phase word PW2. The loop filter 13 generates the phase error word PEW2 based on the phase error word PEW and the clock signal CLK. The gain adjustment circuit 14 generates the frequency control words CBIN and FBIN based on the phase error word PEW2. The oscillator circuit 15 generates the clock signals DCOCLK and DCOCLKB based on the frequency control words CBIN and FBIN and the clock signal CLK. Specifically, in the oscillator circuit 15, the control section 20 converts the frequency control words CBIN and FBIN into the frequency control words CTM and FTM based on the frequency control words CBIN and FBIN and the clock signal CLK, and the oscillation section 30 generates the clock signals DCOCLK and DCOCLKB having the frequency fo in correspondence with the frequency control words CTM and FTM based on the frequency control words CTM and FTM. The phase detection circuit 16 generates the phase word PW2 based on the clock signals DCOCLK and DCOCLKB, the reference clock signal REFCLK, and the clock signal CLK. The retiming circuit 17 performs retiming on the reference clock signal REFCLK at a timing based on the clock signals DCOCLK and DCOCLKB, and outputs the signal that has been subjected to the retiming as the clock signal CLK.

In the control circuit 20, the addition circuit 21 adds the value represented by the frequency control word CBIN and the value represented by the correction word CCF, and thereby generates the frequency control word CBIN2 that represents the result of the addition. In the case where the value represented by the frequency control word CBIN2 is out of the predetermined range, the limiter 22 limits the value represented by the frequency control word CBIN2 to the lower limit value or the upper limit value of the predetermined range, and thereby generates the frequency control word CLMT. The encoder 23 generates the thermometer code based on the frequency control word CLMT. The flip flop 24 performs retiming on the thermometer code generated by the encoder 23 at a timing based on the clock signal CLK, and outputs the thermometer code that has been subjected to the retiming as the frequency control word CTM.

The subtraction circuit 25 subtracts the value represented by the correction word FCF from the value represented by the frequency control word FBIN, and thereby generates the frequency control word FLMT1 that represents the result of the subtraction. The control circuit 40 generates the correction words CCF and FCF based on the frequency control word FLMT1 and the clock signal CLK. In the case where the value represented by the frequency control word FLMT1 is out of the predetermined range Rlim, the limiter 26 limits the value represented by the frequency control word FLMT1 to the lower limit value or the upper limit value of the predetermined range Rlim, and thereby generates the frequency control word FLMT2. The sign conversion circuit 27 converts the frequency control word FLMT2 that represents a signed value into the frequency control word FU that represents an unsigned value. The encoder 28 generates the thermometer code based on the frequency control word FU. The flip flop 29 performs retiming on the thermometer code generated by the encoder 28 at a timing based on the clock signal CLK, and outputs the signal that has been subjected to the retiming as the frequency control word FTM.

(Detailed Operation)

Next, a detailed operation of the frequency synthesizer 1 is described. For example, in the initial state such as a state immediately after the power source is turned on, the frequency synthesizer 1 fixes the frequency control word FBIN for fine adjustment to a predetermined value (for example, "0") and causes the frequency control word CBIN for coarse adjustment to vary to perform a negative feedback operation. At that time, because the values represented by the correction words CCF and FCF are maintained to be "0", the control section 20 converts the value represented by the frequency control word CBIN for coarse adjustment into a thermometer code, and thereby generates a frequency control word CTM. By performing this negative feedback operation, the frequency synthesizer 1 causes the frequency fo to be closer to the targeted frequency f target (Operation P1).

Thereafter, the frequency synthesizer 1 fixes the frequency control word CBIN for coarse adjustment and causes the frequency word FBIN for fine adjustment to perform a negative feedback operation. At that time, the control circuit 40 so generates the correction word FCF that the value of the frequency control word FLMT1 falls within the range Rlim (within the range from −32 to +31, in this example), and generates the correction word CCF corresponding to the generated correction word FCF. By this negative feedback operation, the frequency synthesizer 1 causes the frequency fo to the targeted frequency f target to achieve the phase synchronization state (Operation P2).

The operation P2 is described below in detail. First, description is provided of an operation in a case where the frequency control word FLMT1 represents a value around the upper limit value of the range Rlim. Next, description is provided of an operation in a case where the frequency control word FLMT1 represents a value around the lower limit value of the range Rlim.

Figure 10:
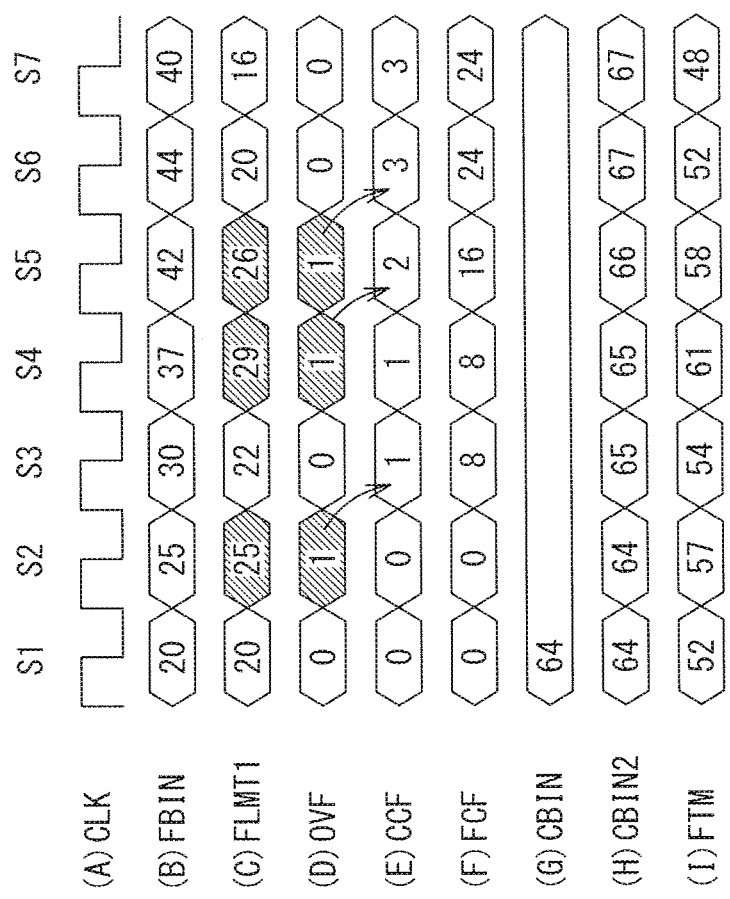
FIG. 10 is a timing diagram illustrating an operation example of a frequency synthesizer illustrated in FIG. 1.

FIG. 10 is a timing diagram illustrating an operation of the oscillator circuit 15 in the case where the frequency control word FLMT1 represents a value around the upper limit value of the range Rlim, in which (A) illustrates a waveform of the clock signal CLK, (B) illustrates the frequency control word FBIN, (C) illustrates the frequency control word FLMT1, (D) illustrates the comparison result word OVF, (E) illustrates the correction word CCF, (F) illustrates the correction word FCF, (G) illustrates the frequency control word CBIN, (H) illustrates the frequency control word CBIN2, and (I) illustrates the frequency control word FTM. In this example, the frequency control word CBIN for coarse adjustment is fixed to "64", and the frequency control word FBIN varies transiently. Accordingly, a state of the oscillator circuit 15 varies as states S1 to S7.

Figure 11:
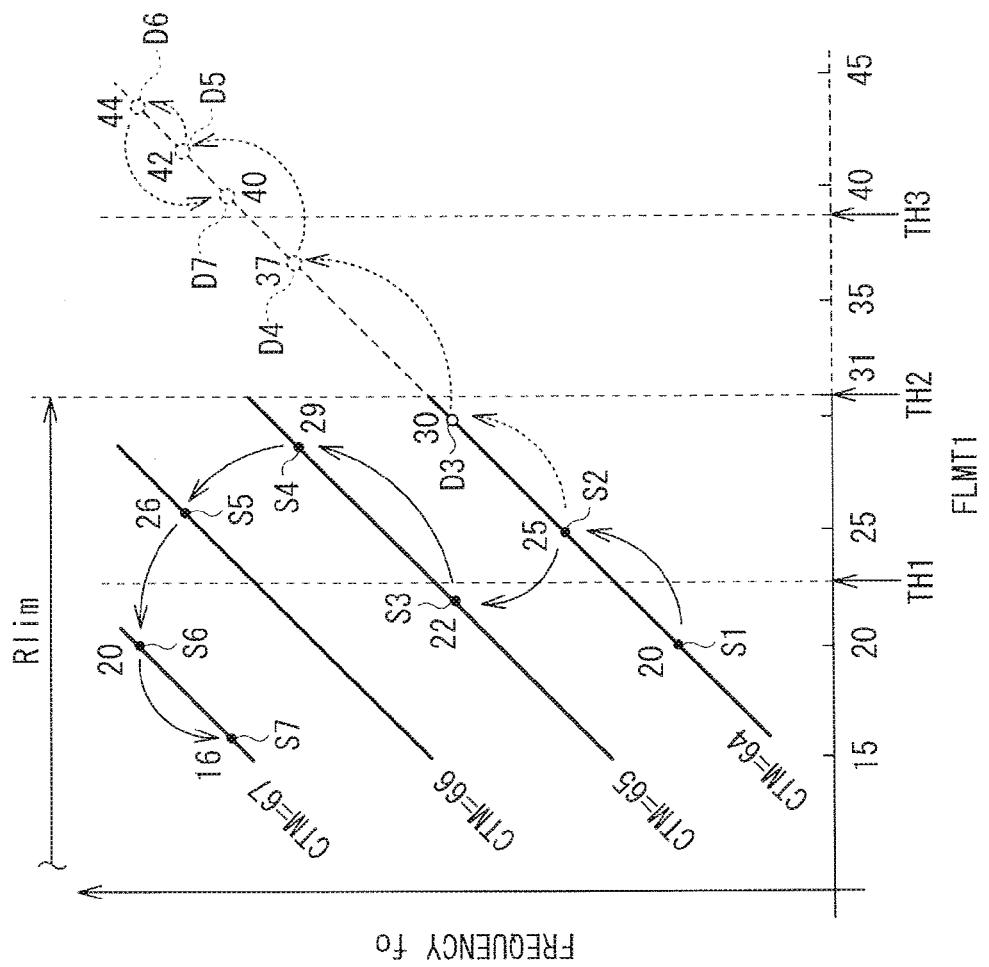
FIG. 11 is an explanation diagram illustrating the operation example of the frequency synthesizer illustrated in FIG. 1.

FIG. 11 illustrates the states S1 to S7 illustrated in FIG. 10 with the use of frequency control characteristics of the oscillation section 30. In FIG. 11, a horizontal axis represents the value of the frequency control word FLMT1, and a vertical axis represents the frequency fo.

In the state S1, the value of the frequency control word CBIN for coarse adjustment is "64" ((G) of FIG. 10), and the value of the frequency control word FBIN for fine adjustment is "20" ((B) of FIG. 10). Because the value of the correction word CCF is "0" ((E) of FIG. 10), the addition circuit 21 causes the value of the frequency control word CBIN2 to be "64" (=64+0) ((H) of FIG. 10). As a result, the control section 20 causes the value of the frequency control word CTM for coarse adjustment to be "64". Similarly, because the value of the correction word FCF is "0" ((F) of FIG. 10), the subtraction circuit 25 causes the value of the frequency control word FLMT1 to be "20" (=20+0) ((C) of FIG. 10). As a result, the control section 20 causes the value of the frequency control word FTM for fine adjustment to be "52" (=20+32) ((I) of FIG. 10). The value "20" of the frequency control word FLMT1 is a value that is equal to or larger than the threshold value TL1 (−24) and is equal to or smaller than the threshold value TH1 (23). The comparison circuit 41 therefore causes the value of the comparison result word OVF to be "0" ((D) of FIG. 10).

In such a manner, the frequency control characteristics corresponding to the value "64" of the frequency control word CTM for coarse adjustment (CTM=64) are selected, and the oscillation section 30 oscillates at the frequency fo in correspondence with the value "20" of the frequency control word FLMT1 in the state Si as illustrated in FIG. 11.

Subsequently, in the state S2, the value of the frequency control word FBIN for fine adjustment varies to "25" ((B) of FIG. 10). Because the value of the comparison result word OVF has been "0" in the previous state 51, the cumulative addition circuit 42 and the multiplication circuit 43 cause both of the values of the correction words CCF and FCF to be "0" ((E) and (F) of FIG. 10). Accordingly, the addition circuit 21 causes the value of the frequency control word CBIN2 to be "64" (=64+0) ((H) of FIG. 10). As a result, the control section 20 causes the value of the frequency control word CTM for coarse adjustment to be "64". The subtraction circuit 25 causes the value of the frequency control word FLMT1 to be "25" (=25+0) ((C) of FIG. 10). As a result, the control section 20 causes the value of the frequency control word FTM for fine adjustment to be "57" (=25+32) ((I) of FIG. 10). The value "25" of the frequency control word FLMT1 is a value that is larger than the threshold value TH1 (=23) and is equal to or smaller than the threshold value TH2 (31). The comparison circuit 41 therefore causes the value of the comparison result word OVF to be "1" ((D) of FIG. 10).

In such a manner, the frequency control characteristics corresponding to the value "64" of the frequency control word CTM for coarse adjustment (CTM=64) are continuously selected, and the oscillation section 30 oscillates at the frequency fo in correspondence with the value "25" of the frequency control word FLMT1 in the state S2 as illustrated in FIG. 11.

Subsequently, in the state S3, the value of the frequency control word FBIN for fine adjustment varies to "30" ((B) of FIG. 10). Because the value of the comparison result word OVF has been "1" in the previous state S2, the cumulative addition circuit 42 causes the value of the correction word CCF to be "1" ((E) of FIG. 10), and the multiplication circuit 43 causes the value of the correction word FCF to be "8" ((F) of FIG. 10). Accordingly, the addition circuit 21 causes the value of the frequency control word CBIN2 to be "65" (=64+1) ((H) of FIG. 10). As a result, the control section 20 causes the value of the frequency control word CTM for coarse adjustment to be "65". The subtraction circuit 25 causes the value of the frequency control word FLMT1 to be "22" (=30−8) ((C) of FIG. 10). As a result, the control section 20 causes the value of the frequency control word FTM for fine adjustment to be "54" (=22+32) ((I) of FIG. 10). The value "22" of the frequency control word FLMT1 is a value that is equal to or larger than the threshold value TL1 (−24) and is equal to or smaller than the threshold value TH1 (23). The comparison circuit 41 therefore causes the value of the comparison result word OVF to be "0" ((D) of FIG. 10).

In such a manner, the frequency control characteristics corresponding to the value "65" of the frequency control word CTM for coarse adjustment (CTM=65) are selected, and the oscillation section 30 oscillates at the frequency fo in correspondence with the value "22" of the frequency control word FLMT1 in the state S3 as illustrated in FIG. 11.

Subsequently, in the state S4, the value of the frequency control word FBIN for fine adjustment varies to "37" ((B) of FIG. 10). Because the value of the comparison result word OVF has been "0" in the previous state S3, the cumulative addition circuit 42 maintains the value "1" of the correction word CCF ((E) of FIG. 10), and the multiplication circuit 43 maintains the value "8" of the correction word FCF ((F) of FIG. 10). Accordingly, the addition circuit 21 causes the value of the frequency control word CBIN2 to be "65" (=64+1) ((H) of FIG. 10). As a result, the control section 20 causes the value of the frequency control word CTM for coarse adjustment to be "65". The subtraction circuit 25 causes the value of the frequency control word FLMT1 to be "29" (=37−8) ((C) of FIG. 10). As a result, the control section 20 causes the value of the frequency control word FTM for fine adjustment to be "61" (=29+32) ((I) of FIG. 10). The value "29" of the frequency control word FLMT1 is a value that is larger than the threshold value TH1 (23) and is equal to or smaller than the threshold value TH2 (31). The comparison circuit 41 therefore causes the value of the comparison result word OVF to be "1" ((D) of FIG. 10).

In such a manner, the frequency control characteristics corresponding to the value "65" of the frequency control word CTM for coarse adjustment (CTM=65) are selected, and the oscillation section 30 oscillates at the frequency fo in accordance with the value "29" of the frequency control word FLMT1 in the state S4 as illustrated in FIG. 11.

Subsequently, in the state S5, the value of the frequency control word FBIN for fine adjustment varies to "42" ((B) of FIG. 10). Because the value of the comparison result word OVF has been "1" in the previous state S4, the cumulative addition circuit 42 causes the value of the correction word CCF to be "2" ((E) of FIG. 10), and the multiplication circuit 43 causes the value of the correction word FCF to be "16" ((F) of FIG. 10). Accordingly, the addition circuit 21 causes the value of the frequency control word CBIN2 to be "66" (=64+2) ((H) of FIG. 10). As a result, the control section 20 causes the value of the frequency control word CTM for coarse adjustment to be "66". The subtraction circuit 25 causes the value of the frequency control word FLMT1 to be "26" (=42−16) ((C) of FIG. 10). As a result, the control section 20 causes the value of the frequency control word FTM for fine adjustment to be "58" (=26+32) ((I) of FIG. 10). The value "26" of the frequency control word FLMT1 is a value that is larger than the threshold value TH1 (23) and is equal to or smaller than the threshold value TH2 (31). The comparison circuit 41 therefore causes the value of the comparison result word OVF to be "1" ((D) of FIG. 10).

In such a manner, the frequency control characteristics corresponding to the value "66" of the frequency control word CTM for coarse adjustment (CTM=66) are selected, and the oscillation section 30 oscillates at the frequency fo in accordance with the value "26" of the frequency control word FLMT1 in the state S5 as illustrated in FIG. 11.

Subsequently, in the state S6, the value of the frequency control word FBIN for fine adjustment varies to "44" ((B) of FIG. 10). Because the value of the comparison result word OVF has been "1" in the previous state S5, the cumulative addition circuit 42 causes the value of the correction word CCF to be "3" ((E) of FIG. 10), and the multiplication circuit 43 causes the value of the correction word FCF to be "24" ((F) of FIG. 10). Accordingly, the addition circuit 21 causes the value of the frequency control word CBIN2 to be "67" (=64+3) ((H) of FIG. 10). As a result, the control section 20 causes the value of the frequency control word CTM for coarse adjustment to be "67". The subtraction circuit 25 causes the value of the frequency control word FLMT1 to be "20" (=44−24) ((C) of FIG. 10). As a result, the control section 20 causes the value of the frequency control word FTM for fine adjustment to be "52" (=20+32) ((I) of FIG. 10). The value "20" of the frequency control word FLMT1 is a value that is equal to or larger than the threshold value TL1 (−24) and is equal to or smaller than the threshold value TH1 (23). The comparison circuit 41 therefore causes the value of the comparison result word OVF to be "0" ((D) of FIG. 10).

In such a manner, the frequency control characteristics corresponding to the value "67" of the frequency control word CTM for coarse adjustment (CTM=67) are selected, and the oscillation section 30 oscillates at the frequency fo in accordance with the value "20" of the frequency control word FLMT1 in the state S6 as illustrated in FIG. 11.

Subsequently, in the state S7, the value of the frequency control word FBIN for fine adjustment varies to "40" ((B) of FIG. 10). Because the value of the comparison result word OVF has been "0" in the previous state S6, the cumulative addition circuit 42 maintains the value "3" of the correction word CCF "3" ((E) of FIG. 10), and the multiplication circuit 43 maintains the value "24" of the correction word FCF ((F) of FIG. 10). Accordingly, the addition circuit 21 causes the value of the frequency control word CBIN2 to be "67" (=64+3) ((H) of FIG. 10). As a result, the control section 20 causes the value of the frequency control word CTM for coarse adjustment to be "67". The subtraction circuit 25 causes the value of the frequency control word FLMT1 to be "16" (=40−24) ((C) of FIG. 10). As a result, the control section 20 causes the value of the frequency control word FTM for fine adjustment to be "48" (=16+32) ((I) of FIG. 10). The value "16" of the frequency control word FLMT1 is a value that is equal to or larger than the threshold value TL1 (−24) and is equal to or smaller than the threshold value TH1 (23). The comparison circuit 41 therefore causes the value of the comparison result word OVF to be "0" ((D) of FIG. 10).

In such a manner, the frequency control characteristics corresponding to the value "67" of the frequency control word CTM for coarse adjustment (CTM=67) are selected, and the oscillation section 30 oscillates at the frequency fo in accordance with the value "16" of the frequency control word FLMT1 in the state S7 as illustrated in FIG. 11.

Figure 12:
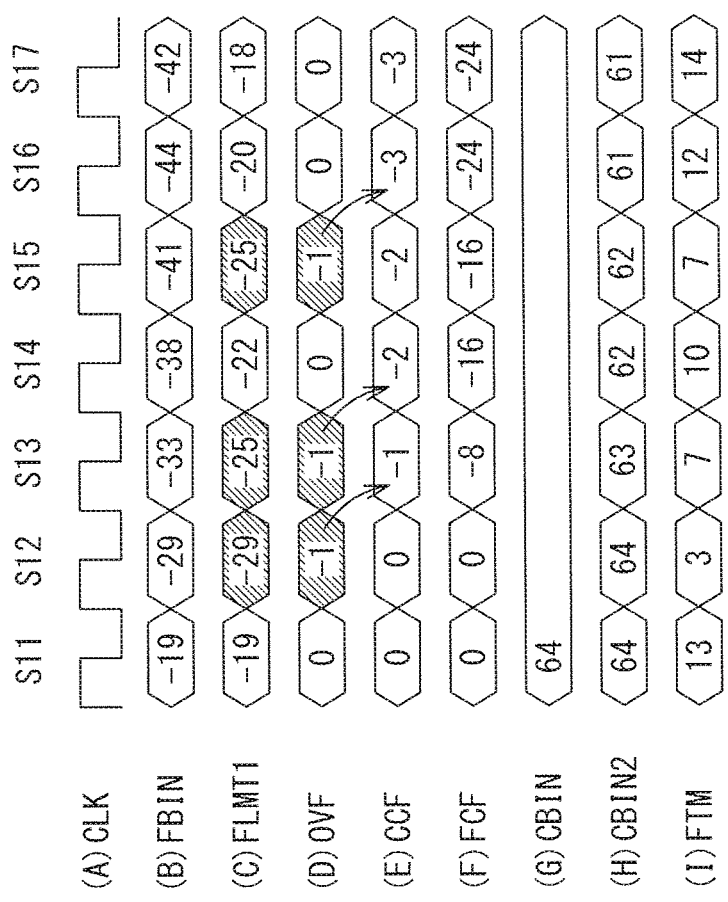
FIG. 12 is a timing diagram illustrating another operation example of the frequency synthesizer illustrated in FIG. 1.

FIG. 12 is a timing diagram illustrating an operation of the oscillator circuit 15 in the case where the frequency control word FLMT1 represents a value around the lower limit value of the range Rlim, in which (A) illustrates the waveform of the clock signal CLK, (B) illustrates the frequency control word FBIN, (C) illustrates the frequency control word FLMT1, (D) illustrates the comparison result word OVF, (E) illustrates the correction word CCF, (F) illustrates the correction word FCF, (G) illustrates the frequency control word CBIN, (H) illustrates the frequency control word CBIN2, and (I) illustrates the frequency control word FTM. In this example, the frequency control word CBIN for coarse adjustment is fixed to "64", and the frequency control word FBIN varies transiently. Accordingly, a state of the oscillator circuit 15 varies as states S11 to S17.

Figure 13:
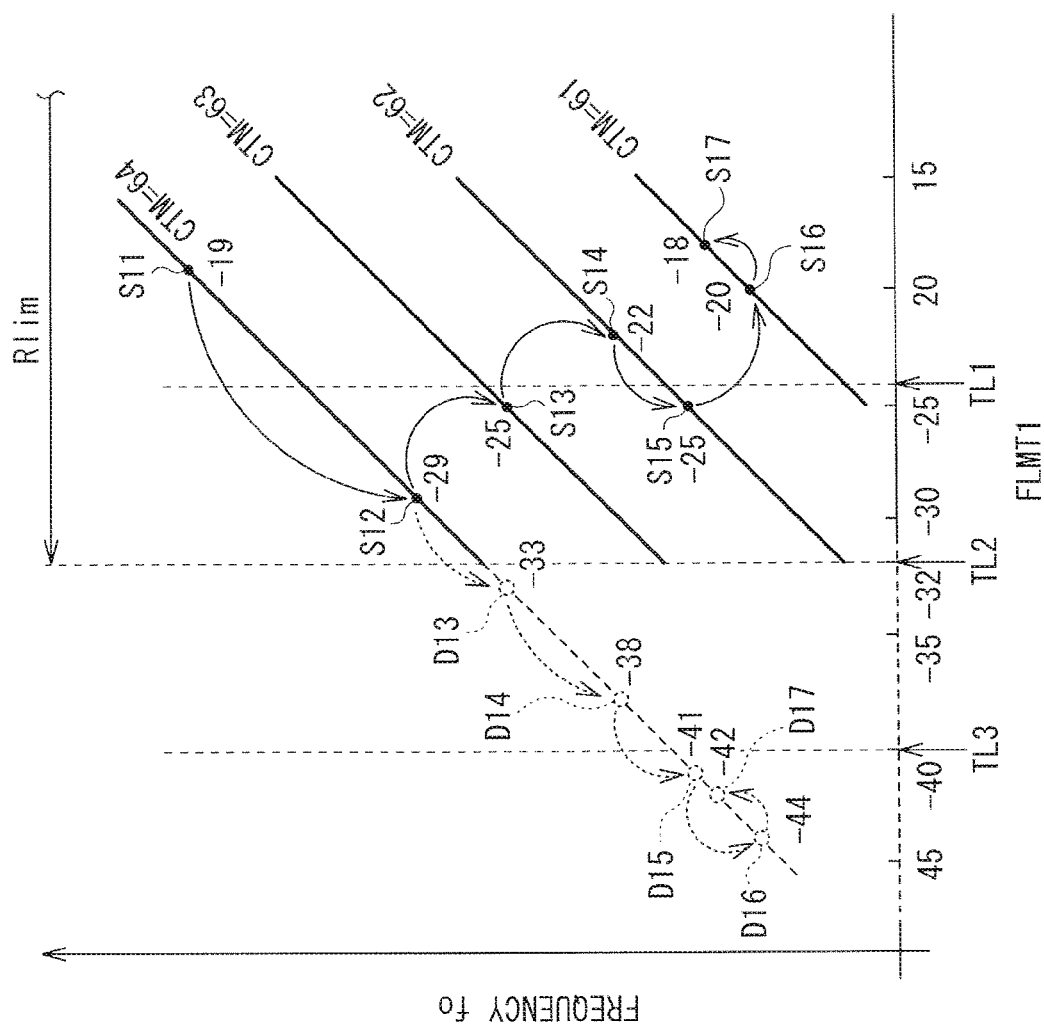
FIG. 13 is an explanation diagram illustrating the another operation example of the frequency synthesizer illustrated in FIG. 1.

FIG. 13 illustrates the states S11 to S17 illustrated in FIG. 12 with the use of the frequency control characteristics of the oscillation section 30.

In the state S11, the value of the frequency control word CBIN for coarse adjustment is "64" ((G) of FIG. 12), and the value of the frequency control word FBIN for fine adjustment is "−19" ((B) of FIG. 12). Because the value of the correction word CCF is "0" ((E) of FIG. 12), the addition circuit 21 causes the value of the frequency control word CBIN2 to be "64" (=64+0) ((H) of FIG. 12). As a result, the control section 20 causes the value of the frequency control word CTM for coarse adjustment to be "64". Similarly, because the value of the correction word FCF is "0" ((F) of FIG. 12), the subtraction circuit 25 causes the value of the frequency control word FLMT1 to be "−19" (=−19+0) ((C) of FIG. 12). As a result, the control section 20 causes the value of the frequency control word FTM for fine adjustment to be "13" (=−19+32) ((I) of FIG. 12). The value "−19" of the frequency control word FLMT1 is a value that is equal to or larger than the threshold value TL1 (−24) and is equal to or smaller than the threshold value TH1 (23). The comparison circuit 41 therefore causes the value of the comparison result word OVF to be "0" ((D) of FIG. 12).

In such a manner, the frequency control characteristics corresponding to the value "64" of the frequency control word CTM for coarse adjustment (CTM=64) are selected, and the oscillation section 30 oscillates at the frequency fo in correspondence with the value "−19" of the frequency control word FLMT1 in the state S11 as illustrated in FIG. 13.

Subsequently, in the state S12, the value of the frequency control word FBIN for fine adjustment varies to "−29" ((B) of FIG. 12). Because the value of the comparison result word OVF has been "0" in the previous state S11, the cumulative addition circuit 42 and the multiplication circuit 43 cause both of the values of the correction words CCF and FCF to be "0" ((E) and (F) of FIG. 12). Accordingly, the addition circuit 21 causes the value of the frequency control word CBIN2 to be "64" (=64+0) ((H) of FIG. 12). As a result, the control section 20 causes the value of the frequency control word CTM for coarse adjustment to be "64". The subtraction circuit 25 causes the value of the frequency control word FLMT1 to be "−29" (=−29+0) ((C) of FIG. 12). As a result, the control section 20 causes the value of the frequency control word FTM for fine adjustment to be "3" (=−29+32) ((I) of FIG. 12). The value "−29" of the frequency control word FLMT1 is a value that is equal to larger than the threshold value TL2 (−32) and is smaller than the threshold value TL1 (−24). The comparison circuit 41 therefore causes the value of the comparison result word OVF to be "−1" ((D) of FIG. 12).

In such a manner, the frequency control characteristics corresponding to the value "64" of the frequency control word CTM for coarse adjustment (CTM=64) are continuously selected, and the oscillation section 30 oscillates at the frequency fo in correspondence with the value "−29" of the frequency control word FLMT1 in the state S12 as illustrated in FIG. 13.

Subsequently, in the state S13, the value of the frequency control word FBIN for fine adjustment varies to "−33" ((B) of FIG. 12). Because the value of the comparison result word OVF has been "−1" in the previous state S12, the cumulative addition circuit 42 causes the value of the correction word CCF to be "−1" ((E) of FIG. 12), and the multiplication circuit 43 causes the value of the correction word FCF to be "−8" ((F) of FIG. 12). Accordingly, the addition circuit 21 causes the value of the frequency control word CBIN2 to be "63" (=64−1) ((H) of FIG. 12). As a result, the control section 20 causes the value of the frequency control word CTM for coarse adjustment to be "63". The subtraction circuit 25 causes the value of the frequency control word FLMT1 to be "−25" (=−33+8) ((C) of FIG. 12). As a result, the control section 20 causes the value of the frequency control word FTM for fine adjustment to be "7" (=−25+32) ((I) of FIG. 12). The value "−25" of the frequency control word FLMT1 is a value that is equal to or larger than the threshold value TL2 (−32) and is smaller than the threshold value TL1 (−24). The comparison circuit 41 therefore causes the value of the comparison result word OVF to be "−1" ((D) of FIG. 12).

In such a manner, the frequency control characteristics corresponding to the value "63" of the frequency control word CTM for coarse adjustment (CTM=63) are selected, and the oscillation section 30 oscillates at the frequency fo in correspondence with the value "−25" of the frequency control word FLMT1 in the state S13 as illustrated in FIG. 13.

Subsequently, in the state S14, the value of the frequency control word FBIN for fine adjustment varies to "−38" ((B) of FIG. 12). Because the value of the comparison result word OVF has been "−1" in the previous state S13, the cumulative addition circuit 42 causes the value of the correction word CCF to be "−2" ((E) of FIG. 12), and the multiplication circuit 43 causes the value of the correction word FCF to be "−16" ((F) of FIG. 12). Accordingly, the addition circuit 21 causes the value of the frequency control word CBIN2 to be "62" (=64−2) ((H) of FIG. 12). As a result, the control section 20 causes the value of the frequency control word CTM for coarse adjustment to be "62". The subtraction circuit 25 causes the value of the frequency control word FLMT1 to be "−22" (=−38+16) ((C) of FIG. 12). As a result, the control section 20 causes the value of the frequency control word FTM for fine adjustment to be "10" (=−22+32) ((I) of FIG. 12). The value "−22" of the frequency control word FLMT1 is a value that is equal to or larger than the threshold value TL1 (−24) and is equal to or smaller than the threshold value TH1 (23). The comparison circuit 41 therefore causes the value of the comparison result word OVF to be "0" ((D) of FIG. 12).

In such a manner, the frequency control characteristics corresponding to the value "62" of the frequency control word CTM for coarse adjustment (CTM=62) are selected, and the oscillation section 30 oscillates at the frequency fo in accordance with the value "−38" of the frequency control word FLMT1 in the state S14 as illustrated in FIG. 13.

Subsequently, in the state S15, the value of the frequency control word FBIN for fine adjustment varies to "−41" ((B) of FIG. 12). Because the value of the comparison result word OVF has been "0" in the previous state S14, the cumulative addition circuit 42 maintains the value "−2" of the correction word CCF ((E) of FIG. 12), and the multiplication circuit 43 maintains the value "−16" of the correction word FCF ((F) of FIG. 12). Accordingly, the addition circuit 21 causes the value of the frequency control word CBIN2 to be "62" (=64−2) ((H) of FIG. 12). As a result, the control section 20 causes the value of the frequency control word CTM for coarse adjustment to be "62". The subtraction circuit 25 causes the value of the frequency control word FLMT1 to be "−25" (=−41+16) ((C) of FIG. 12). As a result, the control section 20 causes the value of the frequency control word FTM for fine adjustment to be "7" (=−25+32) ((I) of FIG. 12). The value "−25" of the frequency control word FLMT1 is a value that is equal to or larger than the threshold word TL2 (−32) and is smaller than the threshold value TL1 (−24). The comparison circuit 41 therefore causes the value of the comparison result word OVF to be "−1" ((D) of FIG. 12).

In such a manner, the frequency control characteristics corresponding to the value "62" of the frequency control word CTM for coarse adjustment (CTM=62) are selected, and the oscillation section 30 oscillates at the frequency fo in correspondence with the value "−25" of the frequency control word FLMT1 in the state S15 as illustrated in FIG. 13.

Subsequently, in the state S16, the value of the frequency control word FBIN for fine adjustment varies to "−44" ((B) of FIG. 12). Because the value of the comparison result word OVF has been "−1" in the previous state S15, the cumulative addition circuit 42 causes the value of the correction word CCF to be "−3" ((E) of FIG. 12), and the multiplication circuit 43 causes the value of the correction word FCF to be "−24" ((F) of FIG. 12). Accordingly, the addition circuit 21 causes the value of the frequency control word CBIN2 to be "61" (=64−3) ((H) of FIG. 12). As a result, the control section 20 causes the value of the frequency control word CTM for coarse adjustment to be "61". The subtraction circuit 25 causes the value of the frequency control word FLMT1 to be "−20" (=−44+24) ((C) of FIG. 12). As a result, the control section 20 causes the value of the frequency control word FTM for fine adjustment to be "12" (=−20+32) ((I) of FIG. 12). The value "−20" of the frequency control word FLMT1 is a value that is equal to or larger than the threshold value TL1 (−24) and is equal to or smaller than the threshold value TH1 (23). The comparison circuit 41 therefore causes the value of the comparison result word OVF to be "0" ((D) of FIG. 12).

In such a manner, the frequency control characteristics corresponding to the value "61" of the frequency control word CTM for coarse adjustment (CTM=61) are selected, and the oscillation section 30 oscillates at the frequency fo in correspondence with the value "−20" of the frequency control word FLMT1 in the state S16 as illustrated in FIG. 13.

Subsequently, in the state S17, the value of the frequency control word FBIN for fine adjustment varies to "−42" ((B) of FIG. 12). Because the value of the comparison result word OVF has been "0" in the previous state S16, the cumulative addition circuit 42 maintains the value "−3" of the correction word CCF ((E) of FIG. 12), and the multiplication circuit 43 maintains the value "−24" of the correction word FCF ((F) of FIG. 12). Accordingly, the addition circuit 21 causes the value of the frequency control word CBIN2 to be "61" (=64−3) ((H) of FIG. 12). As a result, the control section 20 causes the value of the frequency control word CTM for coarse adjustment to be "61". The subtraction circuit 25 causes the value of the frequency control word FLMT1 to be "−18" (=−42+24) ((C) of FIG. 12). As a result, the control section 20 causes the value of the frequency control word FTM for fine adjustment to be "14" (=−18+32) ((I) of FIG. 12). The value "−18" of the frequency control word FLMT1 is a value that is equal to or larger than the threshold value TL1 (−24) and is equal to or smaller than the threshold value TH1 (23). The comparison circuit 41 therefore causes the value of the comparison result word OVF to be "0" ((D) of FIG. 12).

In such a manner, the frequency control characteristics corresponding to the value "61" of the frequency control word CTM for coarse adjustment (CTM=61) are continuously selected, and the oscillation section 30 oscillates at the frequency fo in accordance with the value "−18" of the frequency control word FLMT1 in the state S17 as illustrated in FIG. 13.

As illustrated in FIG. 11, in the oscillator circuit 15, when the value of the frequency control word FLMT1 is larger than the threshold value TH1 in one state (for example, the state S2, S4, or S5), the value of the frequency control word CTM for coarse adjustment is caused to be larger and the setting of the capacitor bank 33 for coarse adjustment is switched in a subsequent state. Similarly, as illustrated in FIG. 13, in the oscillator circuit 15, when the value of the frequency control word FLMT1 is smaller than the threshold value TL1 in one state (for example, the state S12, S13, or S15), the value of the frequency control word CTM for coarse adjustment is caused to be smaller and the setting of the capacitor bank 33 for coarse adjustment is switched in a subsequent state. It is thus possible to allow the frequency control range to be wider while causing the value of the frequency control word FLMT1 to fall within the range Rlim (in the range from −32 to +32, in this example).

Specifically, for example, when the setting of the capacitor bank 33 for coarse adjustment is not switched, states D3 to D7 may be achieved in the states S3 to S7 in FIG. 11, and states D13 to D17 may be achieved in the states S13 to S17 in FIG. 13. In other words, it may be necessary to cause the value of the frequency control word FLMT1 for fine adjustment to vary in a wider range in this case. Also, in a case where the oscillator circuit is caused to operate near the upper limit or the lower limit of the frequency control range, the value of the frequency control word may be larger than the upper limit value or smaller than the lower limit value, which may cause the frequency fo to be saturated.

On the other hand, the oscillator circuit 15 is so configured that the setting of the capacitor bank 33 for coarse adjustment is switched. This makes it possible to allow the frequency control range to be wider while causing the value of the frequency control word FLMT1 for fine adjustment to vary in a narrow range. As a result, it is possible to reduce the possibility for the frequency fo to be saturated.

Moreover, the oscillator circuit 15 is so configured that the setting of the capacitor bank 33 for coarse adjustment is switched when the value of the frequency control word FLMT1 is larger than the threshold value TH1, when the value of the frequency control word FLMT1 is smaller than the threshold value TL1, or the like. This makes it possible to reduce frequency of switching the setting of the capacitor bank 33.

Specifically, for example, as illustrated in FIG. 11, when the state is shifted from the state S5 to the state S6, control for increasing the frequency fo is performed and the setting of the capacitor bank 33 for coarse adjustment is switched in the oscillator circuit 15. On the other hand, when the state is shifted from the state S6 to the state S7, control for decreasing the frequency fo is performed but the setting of the capacitor bank 33 for coarse adjustment is maintained in the oscillator circuit 15. In other words, in the state S6, high frequency fo is achieved by causing the value of the frequency control word CTM to be larger while maintaining the value of the frequency control word FLMT1 to be equal to or smaller than the threshold value TH1. Accordingly, when the state is shifted from the state S6 to the state S7, it is possible to decrease the frequency fo by causing the value of the frequency control word FLMT1 for fine adjustment to be smaller while the value of the frequency control word CTM for coarse adjustment is maintained.

Similarly, for example, as illustrated in FIG. 13, when the state is shifted from the state S15 to the state S16, control for decreasing the frequency fo is performed and the setting of the capacitor bank 33 for coarse adjustment is switched in the oscillator circuit 15. On the other hand, when the state is shifted from the state S16 to the state S17, control for increasing the frequency fo is performed but the setting of the capacitor bank 33 for coarse adjustment is maintained in the oscillator circuit 15. In other words, in the state S16, low frequency fo is achieved by causing the value of the frequency control word CTM to be smaller while maintaining the value of the frequency control word FLMT1 to be equal to or larger than the threshold value TL1. Accordingly, when the state is shifted from the state S16 to the state S17, it is possible to increase the frequency fo by causing the value of the frequency control word FLMT1 for fine adjustment to be larger while the value of the frequency control word CTM for coarse adjustment is maintained.

In such a manner, in a case where the frequency fo is caused to vary once by causing the setting of the capacitor bank 33 for coarse adjustment to vary and the frequency fo is cause to return to the frequency fo before the variation, the setting of the capacitor bank 33 for coarse adjustment is maintained and the setting for capacitor bank 34 for fine adjustment is caused to vary. It is thereby possible to reduce frequency of switching the setting of the capacitor bank 33 for coarse adjustment. This makes it possible to reduce a phase noise resulting from the switching of the setting of the capacitor bank 33 as described below.

Figure 14:
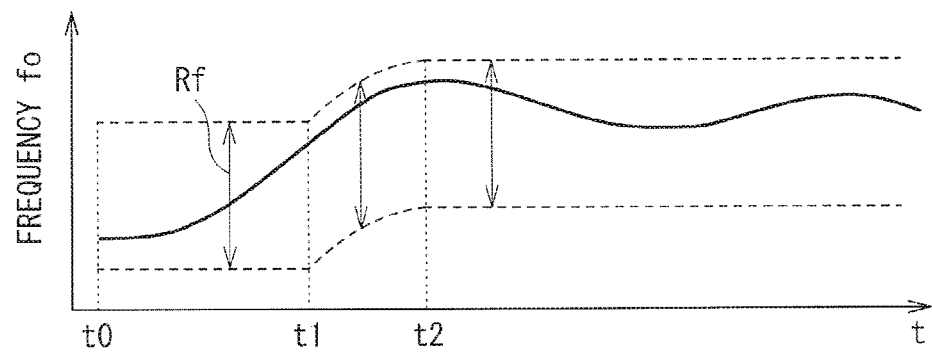
FIG. 14 is a timing diagram illustrating the another operation example of the frequency synthesizer illustrated in FIG. 1.

FIG. 14 is a timing diagram of an operation of the oscillator circuit 15. In FIG. 14, a frequency range Rf is a frequency range that is controllable with the use of the frequency control word FTM for fine adjustment.

In a period from a timing t0 to a timing t2, the gain adjustment circuit 14 in upstream of the oscillator circuit 15 instructs the oscillator circuit 15 to gradually increase the frequency fo through the frequency control words CBIN and FBIN.

In a period from the timing t0 to a timing t1, the frequency control word FTM for fine adjustment varies and the frequency fo is gradually increased in the oscillator circuit 15. In this period, because the value of the frequency control word FLMT1 is a value that is equal to or larger than the threshold value TL1 and is equal to or smaller than the threshold value TH1, the control section 20 does not cause the frequency control word CTM for coarse adjustment to vary. Accordingly, the switching of the setting of the capacitor bank 33 for coarse adjustment is not caused, and the frequency range Rf is therefore fixed.

In a period from the timing t1 to the timing t2, the frequency control word CTM for coarse adjustment gradually varies, and the frequency fo is increased continuously in the oscillator circuit 15. In this period, because the value of the frequency control word FLMT1 is larger than the threshold value TH1, the control section 20 causes the value of the frequency control word CTM for coarse adjustment to be gradually larger. Accordingly, the setting of the capacitor bank 33 for coarse adjustment is switched, and the frequency range Rf is therefore gradually moved.

At and after the timing t2, the gain adjustment circuit 14 in upstream of the oscillator circuit 15 instructs the oscillator circuit 15 to slightly decrease the frequency fo through the frequency control words CBIN and FBIN. The frequency control word FTM for fine adjustment varies and the frequency fo is slightly decreased in the oscillator circuit 15. At and after the timing t2, because the value of the frequency control word FLMT1 is equal to or smaller than the threshold value TH1, the control section 20 maintains the value of the frequency control word CTM for coarse adjustment. Accordingly, the switching of the setting of the capacitor bank 33 for coarse adjustment is not caused, and the frequency range Rf is therefore fixed.

Figure 15:
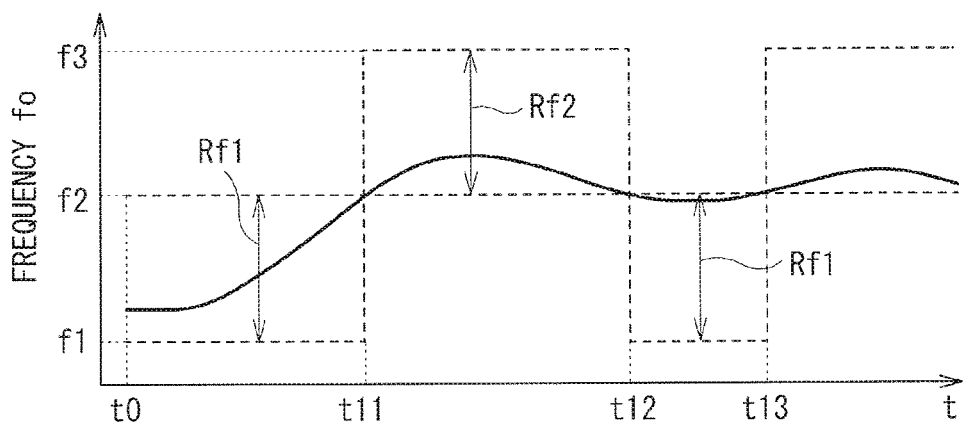
FIG. 15 is a timing diagram illustrating an operation example of a frequency synthesizer according to a comparative example.

As described above, the oscillator circuit 15 is so configured that the setting of the capacitor bank 33 for coarse adjustment is switched when the value of the frequency control word FLMT1 is larger than the threshold value TH1, when the value of the frequency control word FLMT1 is smaller than the threshold value TL1, or the like. Accordingly, it is possible to reduce frequency of switching the setting of the capacitor bank 33. Specifically, for example, in a case where the oscillator circuit is so configured as to compare the value of the frequency control word supplied from the upstream gain adjustment circuit to a predetermined threshold value and switch the setting of the capacitor bank 33 for coarse adjustment based on the magnitude relationship therebetween, the setting of the capacitor bank 33 for coarse adjustment may be switched frequently as illustrated in FIG. 15. In this example, a frequency range Rf1 from a frequency f1 to a frequency f2 is set in a period from a timing t10 to a timing t11 and a period from a timing t12 to a timing t13. Also, a frequency range Rf2 from a frequency f2 to a frequency f3 is set in a period from the timing t11 to the timing t12, at the timing t13, and thereafter. Accordingly, the setting of the capacitor bank 33 for coarse adjustment is switched at the timings t11, t12, and t13. In particular, in a case where the targeted frequency ftarget is around the frequency f2 that is at a border between the frequency ranges Rf1 and Rf2, the setting of the capacitor bank 33 may be switched more frequently. As described above, switching of the setting of the capacitor bank 33 for coarse adjustment may cause a phase noise.

On the other hand, the oscillator circuit 15 is so configured that the setting of the capacitor bank 33 for coarse adjustment is switched when the value of the frequency control word FLMT1 is larger than the threshold value TH1. Accordingly, it is possible to reduce frequency of switching of the setting of the capacitor bank 33 for coarse adjustment as illustrated in FIG. 14, which makes it possible to reduce a phase noise resulting from the switching of the setting of the capacitor bank 33.

Next, description is provided of an operation of the oscillator circuit 15 in a case where the gain adjustment circuit 14 that is in upstream of the oscillator circuit 15 causes the frequency control word FBIN to vary by larger steps.

Figure 16:
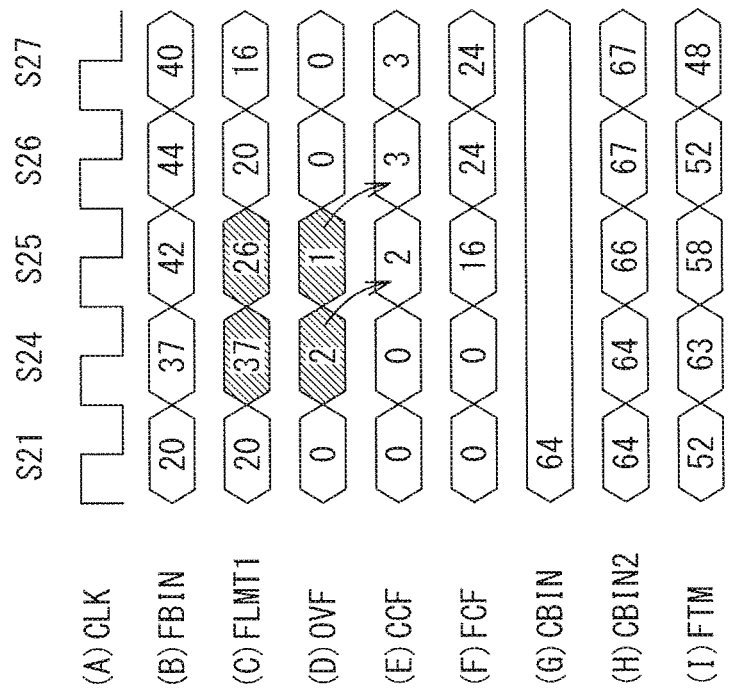
FIG. 16 is a timing diagram illustrating another operation example of the frequency synthesizer illustrated in FIG. 1.

FIG. 16 is a timing diagram illustrating an operation of the oscillator circuit 15 in the case where the frequency control word FLMT1 represents a value around the upper limit value of the range Rlim, in which (A) illustrates the waveform of the clock signal CLK, (B) illustrates the frequency control word FBIN, (C) illustrates the frequency control word FLMT1, (D) illustrates the comparison result word OVF, (E) illustrates the correction word CCF, (F) illustrates the correction word FCF, (G) illustrates the frequency control word CBIN, (H) illustrates the frequency control word CBIN2, and (I) illustrates the frequency control word FTM. In this example, the frequency control word CBIN for coarse adjustment is fixed to "64", and the frequency control word FBIN varies transiently. Accordingly, a state of the oscillator circuit 15 varies as states S21 and from S24 to S27.

Figure 17:
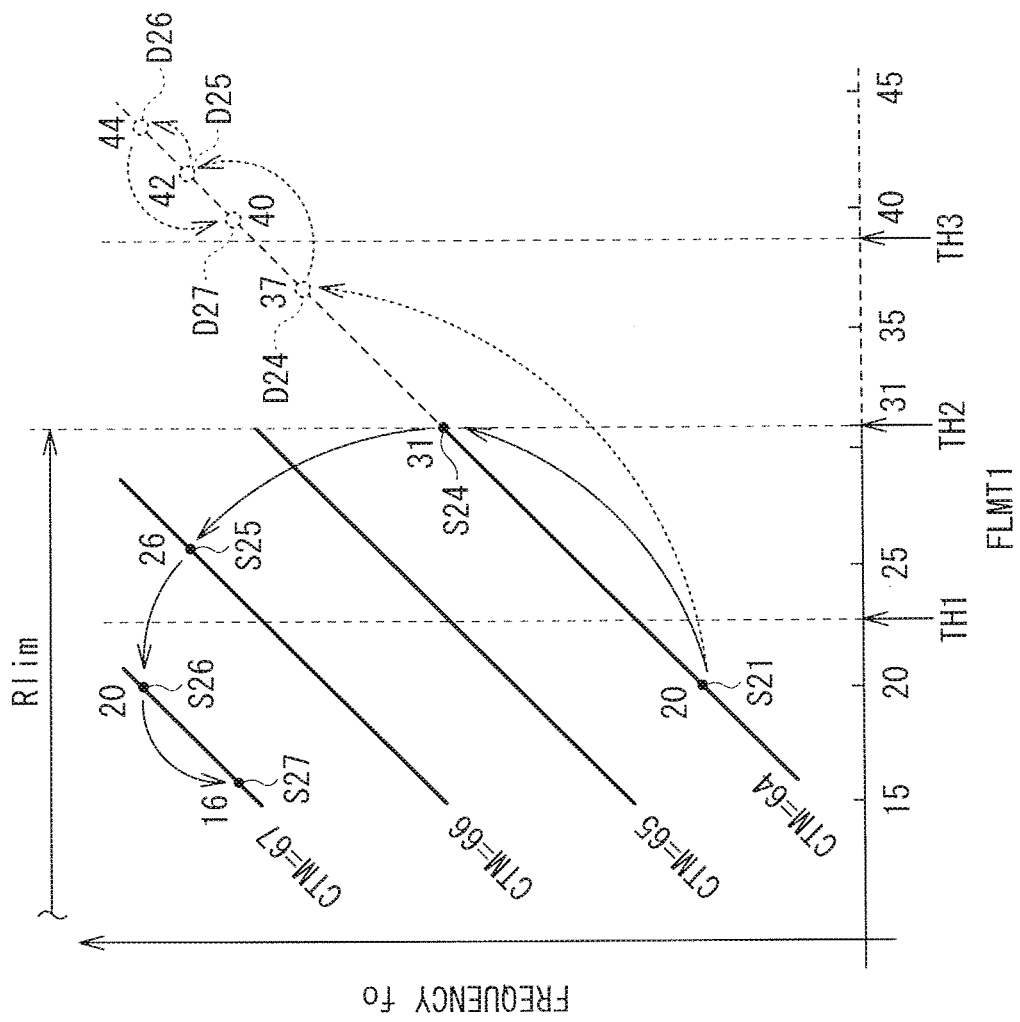
FIG. 17 is an explanation diagram illustrating the another operation example of the frequency synthesizer illustrated in FIG. 1.

FIG. 17 illustrates the states S21 and from S24 to S27 illustrated in FIG. 16 with the use of frequency control characteristics of the oscillation section 30.

In the state S21, the value of the frequency control word CBIN for coarse adjustment is "64" ((G) of FIG. 16), and the value of the frequency control word FBIN for fine adjustment is "20" ((B) of FIG. 16) as in the state S1 in FIGS. 10 and 11. Because the value of the correction word CCF is "0" ((E) of FIG. 16), the addition circuit 21 causes the value of the frequency control word CBIN2 to be "64" ((H) of FIG. 16), and the control section 20 causes the value of the frequency control word CTM for coarse adjustment to be "64". Because the value of the correction word FCF is "0" ((F) of FIG. 16), the subtraction circuit 25 causes the value of the frequency control word FLMT1 to be "20" ((C) of FIG. 16), and the control section 20 causes the value of the frequency control word FTM for fine adjustment to be "52" ((I) of FIG. 16). The comparison circuit 41 causes the value of the comparison result word OVF to be "0" ((D) of FIG. 16) based on the value "20" of the frequency control word FLMT1. In such a manner, the frequency control characteristics corresponding to the value "64" of the frequency control word CTM for coarse adjustment (CTM =64) are selected, and the oscillation section 30 oscillates at the frequency fo in correspondence with the value "20" of the frequency control word FLMT1 in the state S21 as illustrated in FIG. 17.

Subsequently, in the state S24, the value of the frequency control word FBIN for fine adjustment varies to "37" ((B) of FIG. 16). Because the value of the comparison result word OVF has been "0" in the previous state S21, the cumulative addition circuit 42 and the multiplication circuit 43 cause both of the values of the correction words CCF and FCF to be "0" ((E) and (F) of FIG. 16). Accordingly, the addition circuit 21 causes the value of the frequency control word CBIN2 to be "64" (=64+0) ((H) of FIG. 16). As a result, the control section 20 causes the value of the frequency control word CTM for coarse adjustment to be "64". The subtraction circuit 25 causes the value of the frequency control word FLMT1 to be "37" (=37−0) ((C) of FIG. 16). As a result, the control section 20 causes the value of the frequency control word FTM for fine adjustment to be "63" ((I) of FIG. 16). Specifically, the value "37" of the frequency control word FLMT1 is limited to the upper limit value (31) by the limiter 26. The value of the frequency control word FTM for fine adjustment is therefore caused to be "63" (=31+32). The value "37" of the frequency control word FLMT1 is a value that is larger than the threshold value TH2 (31) and is smaller than the threshold value TH2 (39). The comparison circuit 41 therefore causes the value of the comparison result word OVF to be "2" ((D) of FIG. 16).

In such a manner, the frequency control characteristics corresponding to the value "64" of the frequency control word CTM for coarse adjustment (CTM=64) are continuously selected, and the oscillation section 30 oscillates at the frequency fo in accordance with the value "31" of the frequency control word FLMT1 in the state S24 as illustrated in FIG. 17.

Subsequently, in the state S25, the value of the frequency control word FBIN for fine adjustment varies to "42" ((B) of FIG. 16). Because the value of the comparison result word OVF has been "2" in the previous state S24, the cumulative addition circuit 42 causes the value of the correction word CCF to be "2" ((E) of FIG. 16), and the multiplication circuit 43 causes the value of the correction word FCF to be "16" ((F) of FIG. 16). Accordingly, the addition circuit 21 causes the value of the frequency control word CBIN2 to be "66" (=64+ 2) ((H) of FIG. 16). As a result, the control section 20 causes the value of the frequency control word CTM for coarse adjustment to be "66". The subtraction circuit 25 causes the value of the frequency control word FLMT1 to be "26" (=42− 16) ((C) of FIG. 16). As a result, the control section 20 causes the value of the frequency control word FTM for fine adjustment to be "58" (=26+32) ((I) of FIG. 16). The value "26" of the frequency control word FLMT1 is a value that is larger than the threshold value TH1 (23) and is equal to or smaller than the threshold value TH2 (31). The comparison circuit 41 therefore causes the value of the comparison result word OVF to be "1" ((D) of FIG. 16).

In such a manner, the frequency control characteristics corresponding to the value "66" of the frequency control word CTM for coarse adjustment (CTM=66) are selected, and the oscillation section 30 oscillates at the frequency fo in accordance with the value "26" of the frequency control word FLMT1 in the state S25 as illustrated in FIG. 17.

In other words, in this example, the value of the frequency control word CTM for coarse adjustment is caused to vary by 2 when the state varies from the state S24 to the state S25, unlike in the cases illustrated in FIGS. 10 and 11. Accordingly, it is possible to cause the setting of the capacitor bank 33 for coarse adjustment to vary faster.

Operations in the subsequent states S26 and S27 are similar to the operations in the states S6 and S7 illustrated in FIGS. 10 and 11.

In such a manner, the oscillator circuit 15 is so configured that the comparison circuit 41 compares the value of the frequency control word FLMT1 to the plurality of threshold values as illustrated in FIG. 6. This makes it possible to cause the correction word CCF to vary largely in the case where the frequency control word FBIN is caused to vary in a larger step, which makes it possible to cause the setting of the capacitor bank 33 for coarse adjustment to vary faster.

[Effects]

As described above, in the present embodiment, the setting of the capacitor bank for coarse adjustment is switched when the value of the frequency control word FLMT1 is larger than the threshold value TH1, when the value of the frequency control word FLMT1 is smaller than the threshold value TL1, or the like. This makes it possible to reduce frequency of switching the setting of the capacitor bank for coarse adjustment, and a phase noise is allowed to be reduced accordingly.

[Modification 1]

The configuration of the frequency synthesizer is not limited to the configuration illustrated in FIG. 1. Another configuration is described below in detail.

Figure 18:
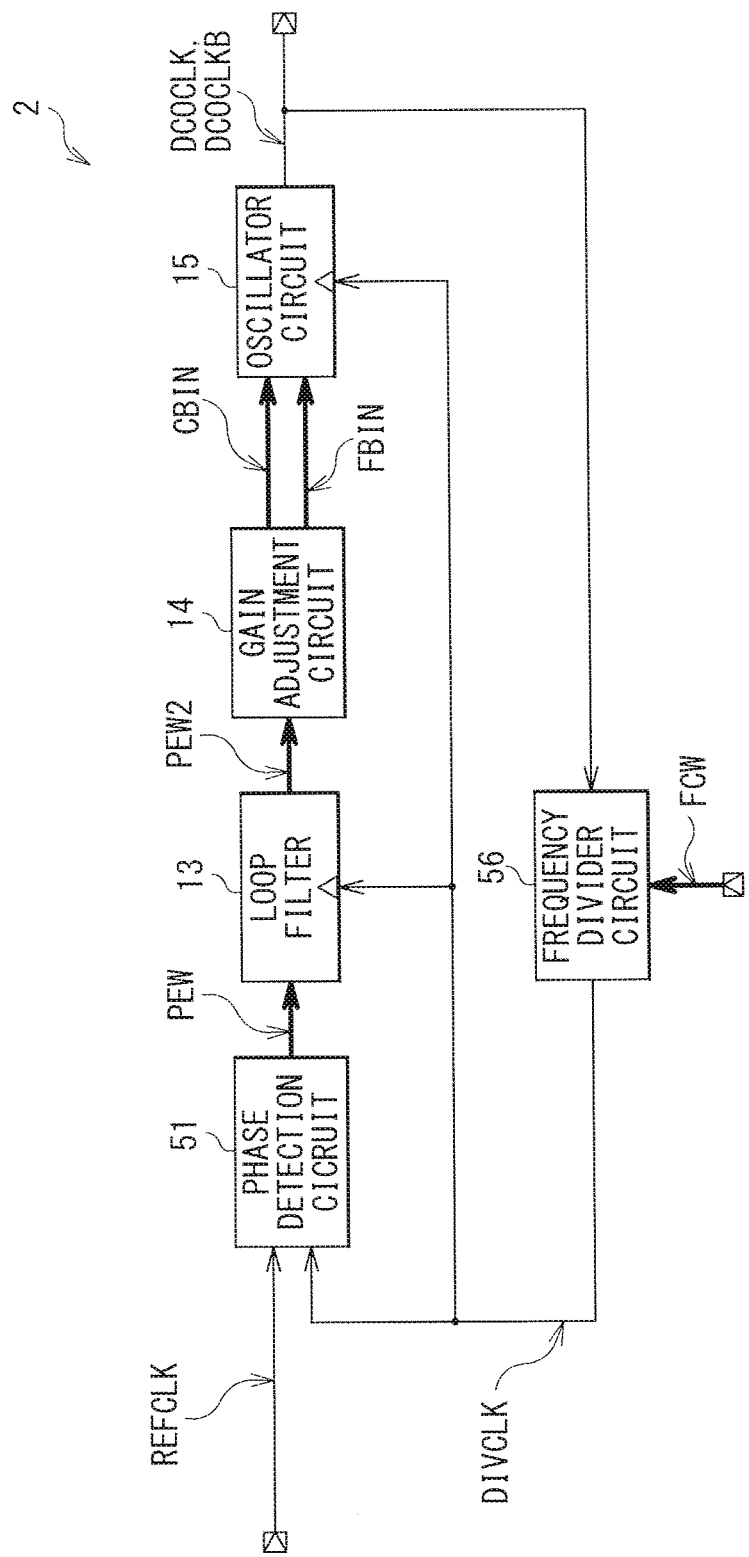
FIG. 18 is a block diagram illustrating a configuration example of a frequency synthesizer according to a modification of the embodiment.

FIG. 18 illustrates a configuration example of a frequency synthesizer 2 according to the present modification. The frequency synthesizer 2 has a configuration similar to a configuration of an analog PLL. The frequency synthesizer 2 may include a phase detection circuit 51 and a frequency divider circuit 56.

The phase detection circuit 51 is configured to determine a phase error value of the reference clock signal REFCLK and a clock signal DIVCLK based thereon, and output the determined phase error value as the phase error word PEW. The phase detection circuit 51 may be configured of a TDC (Time to Digital Converter), for example.

The frequency divider circuit 56 is configured to divide a frequency of the differential signal including the clock signals DCOCLK and DCOCLKB by the frequency division ratio represented by the frequency division ratio word FCW, and output the resultant as the clock signal DIVCLK. Further, the frequency divider circuit 56 supplies the clock signal DIVCLK to the loop filter 13 and the oscillator circuit 15 in addition to the phase detection circuit 51.

Effects similar to the effects of the frequency synthesizer 1 according to the above-described embodiment are achieved also in this configuration.

The present technology is described above referring to some embodiments and the modification thereof. However, the present technology is not limited to the embodiments and the modification described above, and may be variously modified.

For example, in the embodiment and the like described above, for example, the number of device of the variable capacitors 35 in the variable capacitor group 36 is set to "8", and the multiplication value used in the multiplication circuit 43 is set to "8". However, the number of the variable capacitors 35 in the variable capacitor group 36 and the multiplication value are not limited thereto, and may be any value as long as the number of the variable capacitors 35 in the variable capacitor group 36 and the multiplication value are equal to each other. In a case where the arithmetic performed in the multiplication circuit 43 is achieved by shift of bits, the number of the capacitors 35 in the variable capacitor group 36 and the multiplication value may be desirably a value of a power of 2 (for example, 4, 16, etc.).

Moreover, examples of the numbers of bits of the frequency control words CBIN, FBIN, CTM, FTM, etc. are described in the embodiment and the like above. However, the numbers of bits of the frequency control words CBIN, FBIN, CTM, FTM, etc. are not limited thereto, and may be changed in a range that achieves a desired performance.

It is to be noted that the effects described herein are mere examples. The effects of the present technology are not limited thereto, and may include other effect.

It is possible to achieve at least the following configurations from the above-described example embodiments and the modifications of the technology.

(1) An oscillator circuit, including:
an arithmetic section configured to correct a first input code value and thereby generate a first code value that is within a first predetermined range, the arithmetic section being configured to correct a second input code value in correspondence with a correction amount of the first input code value and thereby generate a second code value, and the first predetermined range being narrower than a range of the first input code value; and an oscillation section configured to generate an oscillation signal having a frequency that varies at first sensitivity based on the first code value and varies at second sensitivity based on the second code value, the second sensitivity being higher than the first sensitivity.

(2) The oscillator circuit according to (1), wherein a direction in which the frequency of the oscillation signal varies in response to correction of the first input code value is opposite from a direction in which the frequency of the oscillation signal varies in response to correction of the second input code value.

(3) The oscillator circuit according to (1) or (2), wherein a correction amount of the second input code value is an amount that is in correspondence with a sensitivity ratio between the first sensitivity and the second sensitivity and is in accordance with the correction amount of the first input code value.

(4) The oscillator circuit according to any one of (1) to (3), wherein
the arithmetic section includes
a comparison section configured to compare the first code value to an upper limit value and a lower limit value of a second predetermined range and thereby generate a comparison result value, the second predetermined range being narrower than the first predetermined range,
a cumulative addition section configured to cumulatively add the comparison result value and thereby determine a cumulative value, and
a correction section configured to correct the first input code value based on the cumulative value and correct the second input code value based on the cumulative value.

(5) The oscillator circuit according to (4), wherein the comparison section further compares the first code value to an upper limit value and a lower limit value of the first predetermined range, and thereby generates the comparison result value.

(6) The oscillator circuit according to (4) or (5), wherein
the comparison result value is a positive value when the first code value is larger than the upper limit value of the second predetermined range, and is a negative value when the first code value is smaller than the lower limit value of the second predetermined range, and
the correction section increases the second input code value by the cumulative value to thereby correct the second input code value, and decreases the first input code value by a value of a product of the cumulative value and a value obtained by dividing the second sensitivity by the first sensitivity to thereby correct the first input code value.

(7) The oscillator circuit according to any one of (1) to (6), wherein
the oscillation section includes
an inductor,
a first capacitor bank connected in parallel to the inductor and having a capacitance value that varies based on the first code value, and
a second capacitor bank connected in parallel to the inductor and having a capacitance value that varies based on the second code value.

(8) The oscillator circuit according to (7), wherein
the first capacitor bank includes a plurality of first variable capacitors each having a capacitance value that varies at a variation rate in correspondence with the first sensitivity, and
the second capacitor bank includes a plurality of second variable capacitors each having a capacitance value that varies at a variation rate in correspondence with the second sensitivity.

(9) A frequency synthesizer, including:
a reference phase generation circuit configured to generate a reference phase signal;
a phase comparison circuit configured to detect a phase difference between the reference phase signal and a feedback phase signal;
a frequency control circuit configured to generate a first input code value and a second input code value based on a result of detection performed by the phase comparison circuit;
an oscillator circuit configured to generate an oscillation signal based on the first input code value and the second input code value; and
a phase detection circuit configured to determine a phase of the oscillation signal and output the determined phase as the feedback phase signal,
the oscillator circuit including
an arithmetic section configured to correct the first input code value and thereby generate a first code value that is within a first predetermined range, the arithmetic section being configured to correct the second input code value in correspondence with a correction amount of the first input code value and thereby generate a second code value, and the first predetermined range being narrower than a range of the first input code value, and
an oscillation section configured to generate the oscillation signal having a frequency that varies at first sensitivity based on the first code value and varies at second sensitivity based on the second code value, the second sensitivity being higher than the first sensitivity.

(10) A frequency synthesizer, including:
a phase comparison circuit configured to detect a phase difference between an input clock signal and a feedback clock signal;
a frequency control circuit configured to generate a first input code value and a second input code value based on a result of detection performed by the phase comparison circuit;
an oscillator circuit configured to generate an oscillation signal based on the first input code value and the second input code value; and
a frequency divider circuit configured to divide a frequency of the oscillation signal and thereby generate the feedback clock signal,
the oscillator circuit including
an arithmetic section configured to correct the first input code value and thereby generate a first code value that is within a first predetermined range, the arithmetic section being configured to correct the second input code value in correspondence with a correction amount of the first input code value and thereby generate a second code value, and the first predetermined range being narrower than a range of the first input code value, and
an oscillation section configured to generate the oscillation signal having the frequency that varies at first sensitivity based on the first code value and varies at second sensitivity based on the second code value, the second sensitivity being higher than the first sensitivity.

It should be understood by those skilled in the art that various modifications, combinations, sub-combinations, and alterations may occur depending on design requirements and other factors insofar as they are within the scope of the appended claims or the equivalents thereof.

What is claimed is:

1. An oscillator circuit, comprising:
an arithmetic section configured to correct a first input code value and thereby generate a first code value that is within a first predetermined range, the arithmetic section being configured to correct a second input code value in correspondence with a correction amount of the first input code value and thereby generate a second code value, and the first predetermined range being narrower than a range of the first input code value; and
an oscillation section configured to have an oscillation signal having a frequency that varies at first sensitivity based on the first code value and varies at second sensitivity based on the second code value, the second sensitivity being higher than the first sensitivity.

2. The oscillator circuit according to claim 1, wherein a direction in which the frequency of the oscillation signal varies in response to correction of the first input code value is opposite from a direction in which the frequency of the oscillation signal varies in response to correction of the second input code value.

3. The oscillator circuit according to claim 1, wherein a correction amount of the second input code value is an amount that is in correspondence with a sensitivity ratio between the first sensitivity and the second sensitivity and is in correspondence with the correction amount of the first input code value.

4. The oscillator circuit according to claim 1, wherein
the arithmetic section includes
a comparison section configured to compare the first code value to an upper limit value and a lower limit value of a second predetermined range and thereby generate a comparison result value, the second predetermined range being narrower than the first predetermined range,
a cumulative addition section configured to cumulatively add the comparison result value and thereby determine a cumulative value, and
a correction section configured to correct the first input code value based on the cumulative value and correct the second input code value based on the cumulative value.

5. The oscillator circuit according to claim 4, wherein the comparison section further compares the first code value to an upper limit value and a lower limit value of the first predetermined range, and thereby generates the comparison result value.

6. The oscillator circuit according to claim 4, wherein
the comparison result value is a positive value when the first code value is larger than the upper limit value of the second predetermined range, and is a negative value when the first code value is smaller than the lower limit value of the second predetermined range, and the correction section increases the second input code value by the cumulative value to thereby correct the second input code value, and decreases the first input code value by a value of a product of the cumulative value and a value obtained by dividing the second sensitivity by the first sensitivity to thereby correct the first input code value.

7. The oscillator circuit according to claim 1, wherein the oscillation section includes an inductor, a first capacitor bank connected in parallel to the inductor and having a capacitance value that varies based on the first code value, and a second capacitor bank connected in parallel to the inductor and having a capacitance value that varies based on the second code value.

8. The oscillator circuit according to claim 7, wherein the first capacitor bank includes a plurality of first variable capacitors each having a capacitance value that varies at a variation rate in correspondence with the first sensitivity, and the second capacitor bank includes a plurality of second variable capacitors each having a capacitance value that varies at a variation rate in correspondence with the second sensitivity.

9. A frequency synthesizer, comprising:

a reference phase generation circuit configured to generate a reference phase signal;

a phase comparison circuit configured to detect a phase difference between the reference phase signal and a feedback phase signal;

a frequency control circuit configured to generate a first input code value and a second input code value based on a result of detection performed by the phase comparison circuit;

an oscillator circuit configured to generate an oscillation signal based on the first input code value and the second input code value; and a phase detection circuit configured to determine a phase of the oscillation signal and output the determined phase as the feedback phase signal, the oscillator circuit including an arithmetic section configured to correct the first input code value and thereby generate a first code value that is within a first predetermined range, the arithmetic section being configured to correct the second input code value in correspondence with a correction amount of the first input code value and thereby generate a second code value, and the first predetermined range being narrower than a range of the first input code value, and an oscillation section configured to generate the oscillation signal having a frequency that varies at first sensitivity based on the first code value and varies at second sensitivity based on the second code value, the second sensitivity being higher than the first sensitivity.

10. A frequency synthesizer, comprising:

a phase comparison circuit configured to detect a phase difference between an input clock signal and a feedback clock signal;

a frequency control circuit configured to generate a first input code value and a second input code value based on a result of detection performed by the phase comparison circuit;

an oscillator circuit configured to generate an oscillation signal based on the first input code value and the second input code value; and a frequency divider circuit configured to divide a frequency of the oscillation signal and thereby generate the feedback clock signal, the oscillator circuit including an arithmetic section configured to correct the first input code value and thereby generate a first code value that is within a first predetermined range, the arithmetic section being configured to correct the second input code value in correspondence with a correction amount of the first input code value and thereby generate a second code value, and the first predetermined range being narrower than a range of the first input code value, and an oscillation section configured to generate the oscillation signal having the frequency that varies at first sensitivity based on the first code value and varies at second sensitivity based on the second code value, the second sensitivity being higher than the first sensitivity.

* * * * *